(12) United States Patent
Gorobets et al.

(10) Patent No.: US 11,914,886 B2
(45) Date of Patent: Feb. 27, 2024

(54) NONVOLATILE MEMORY WITH ON-CHIP ENCODING FOR FOGGY-FINE PROGRAMMING

(71) Applicant: Western Digital Technologies, Inc., San Jose, CA (US)

(72) Inventors: Sergey Anatolievich Gorobets, Edinburgh (GB); Jack Frayer, Boulder Creek, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 198 days.

(21) Appl. No.: 17/172,362

(22) Filed: Feb. 10, 2021

(65) Prior Publication Data

US 2022/0107751 A1  Apr. 7, 2022

Related U.S. Application Data

(60) Provisional application No. 63/086,732, filed on Oct. 2, 2020.

(51) Int. Cl.
*G06F 3/06* (2006.01)

(52) U.S. Cl.
CPC .......... *G06F 3/0655* (2013.01); *G06F 3/0619* (2013.01); *G06F 3/0679* (2013.01)

(58) Field of Classification Search
CPC .... G06F 3/0655; G06F 3/0619; G06F 3/0679; G06F 3/0659; G06F 3/0656; G06F 3/0688; G06F 3/061; G06F 12/02; G06F 12/0246; G06F 11/1072; G06F 11/1012; G06F 11/1044; G06F 11/1068; G06F 2212/2022; G06F 11/1048; G11C 11/5628; G11C 11/5642; G11C 16/10; G11C 16/26; G11C 11/5621; G11C 11/5671; G11C 16/3404;
(Continued)

(56) References Cited

U.S. PATENT DOCUMENTS 8,885,410 B2   11/2014   Marcu et al.
9,400,713 B2   7/2016   Gorobets
(Continued)

OTHER PUBLICATIONS

"XORgate", Aug. 16, 2019, Wikipedia, as preserved by the Internet Archive on Aug. 16, 2019, pp. 1-5 http://web.archive.org/web/20190816010351/https://en.wikipedia.org/wiki/XOR_gate (Year: 2019).*

(Continued)

*Primary Examiner* — Curtis James Kortman
(74) *Attorney, Agent, or Firm* — Vierra Magen Marcus LLP

(57) ABSTRACT

A non-volatile storage apparatus includes a plurality of non-volatile memory cells formed on a memory die, each non-volatile memory cell configured to hold a plurality of bits of data, and a control circuit formed on the memory die. The control circuit is configured to calculate parity data for data to be stored in the memory cells and program the memory cells to first distributions. The control circuit is also configured to read memory cells in the first distributions, recover the data from results of reading the memory cells in the first distributions combined with the parity data, and further program the memory cells from the first distributions to second distributions to store the data.

20 Claims, 29 Drawing Sheets

(58) Field of Classification Search
CPC . G11C 16/3418; G11C 16/0483; G11C 16/08; G11C 2211/5641; G11C 2211/5642; G11C 2029/0411; G11C 29/52; G11C 29/42
See application file for complete search history.

(56) References Cited

U.S. PATENT DOCUMENTS

| | | | |
|---|---|---|---|
| 2011/0145668 A1* | 6/2011 | Kim | G06F 11/1072 |
| | | | 714/E11.002 |
| 2011/0252288 A1 | 10/2011 | Sharon et al. | |
| 2016/0004596 A1* | 1/2016 | D'Abreu | G06F 11/108 |
| | | | 714/773 |
| 2016/0098319 A1* | 4/2016 | Gorobets | G11C 16/10 |
| | | | 714/773 |
| 2019/0013086 A1* | 1/2019 | Spencer | G06F 13/1673 |
| 2019/0114103 A1* | 4/2019 | Shuck | G11C 16/10 |
| 2020/0192807 A1 | 6/2020 | Rub et al. | |
| 2020/0194064 A1* | 6/2020 | Barndt | G11C 29/781 |
| 2020/0286562 A1 | 9/2020 | Gorobets et al. | |
| 2021/0158874 A1* | 5/2021 | Jang | G11C 16/10 |

OTHER PUBLICATIONS

John Crowe and Barrie Hayes-Gill, Introduction to Digital Electronics: Chapter 1—Fundamentals, 1998, Elsevier, pp. 1-28 ISBN: 978-0-340-64570-3 DOI: https://doi.org/10.1016/B978-0-340-64570-3.X5000-X (Year: 1998).*
U.S. Appl. No. 16/899,374, filed Jun. 11, 2020.

* cited by examiner

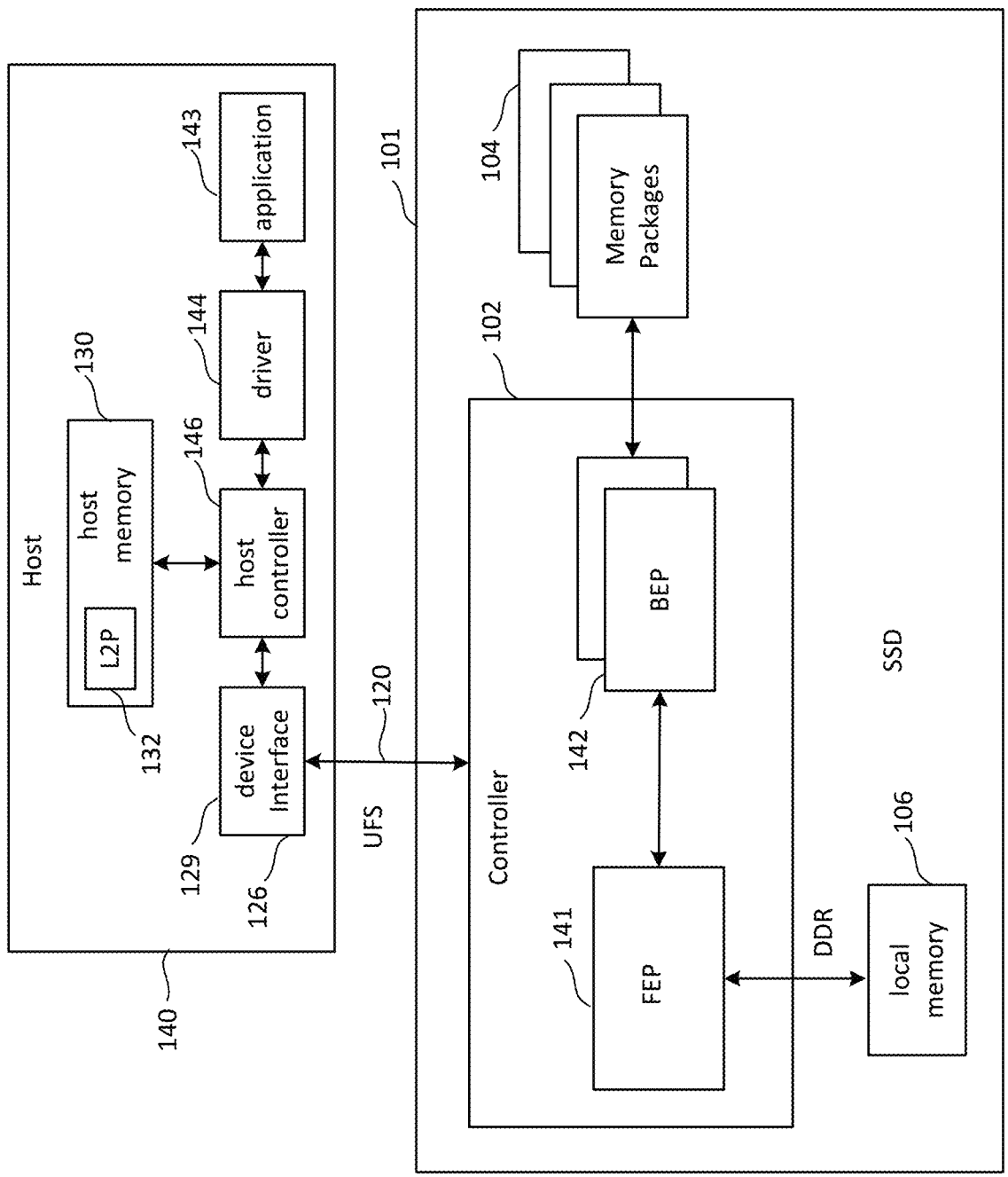

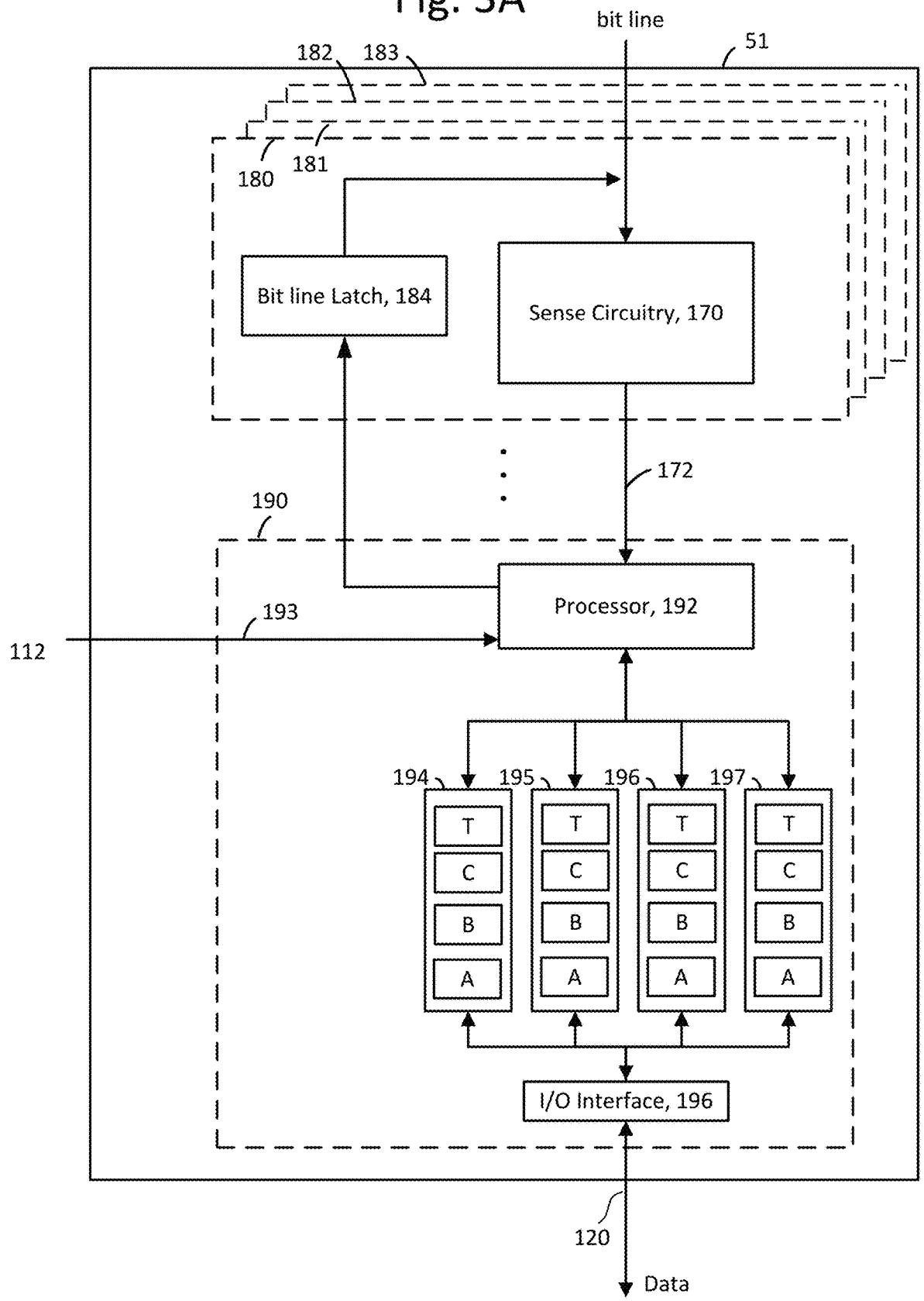

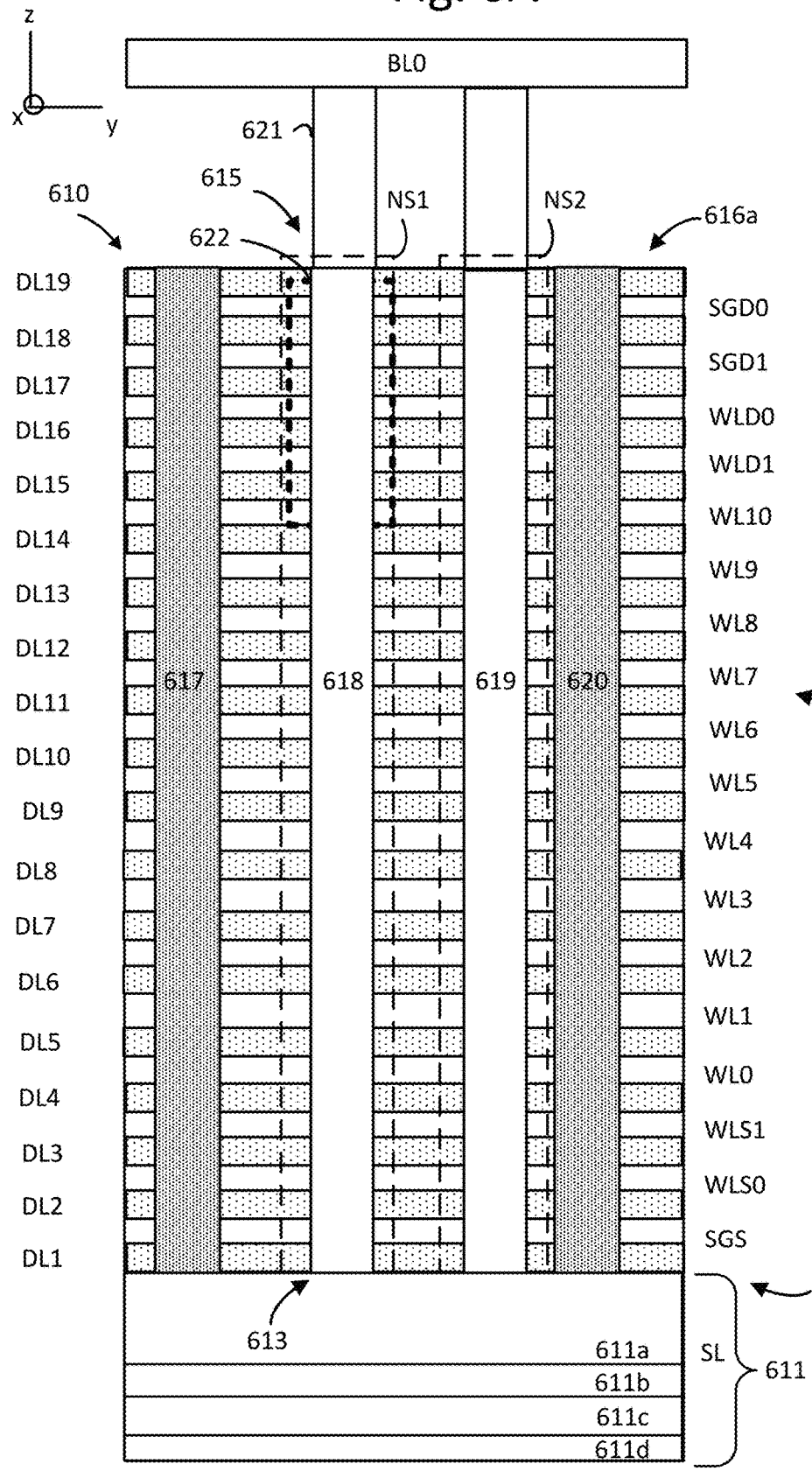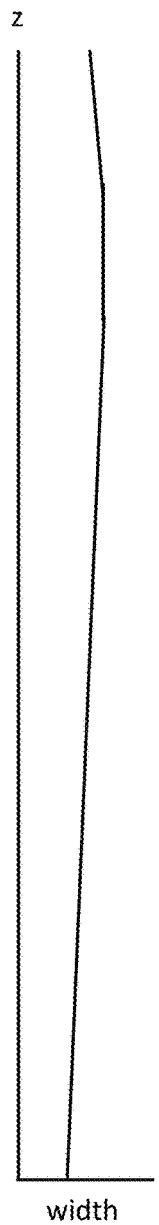

Fig. 11

| WL | STAGE | STR0 | STR1 | STR2 | STR3 |
|---|---|---|---|---|---|
| 127 | FINE | 1020 | 1021 | 1022 | 1023 |
|  | FOGGY | 1012 | 1014 | 1016 | 1018 |
| 126 | FINE | 1013 | 1015 | 1017 | 1019 |
|  | FOGGY | 1004 | 1006 | 1008 | 1010 |
| ... |  |  |  |  |  |
| 3 | FINE | 29 | 31 | 33 | 35 |
|  | FOGGY | 20 | 22 | 24 | 26 |
| 2 | FINE | 21 | 23 | 25 | 27 |
|  | FOGGY | 12 | 14 | 16 | 18 |
| 1 | FINE | 13 | 15 | 17 | 19 |
|  | FOGGY | 4 | 6 | 8 | 10 |
| 0 | FINE | 5 | 7 | 9 | 11 |
|  | FOGGY | 0 | 1 | 2 | 3 |

Fig. 12

| Distribution | Digital value | Parity |
|---|---|---|
| S0 | 1111 | 0 |
| S1 | 0111 | 1 |
| S2 | 0101 | 0 |
| S3 | 1101 | 1 |
| S4 | 1100 | 0 |
| S5 | 0100 | 1 |
| S6 | 0000 | 0 |
| S7 | 0001 | 1 |
| S8 | 0011 | 0 |
| S9 | 0010 | 1 |
| S10 | 0110 | 0 |
| S11 | 1110 | 1 |
| S12 | 1010 | 0 |
| S13 | 1000 | 1 |
| S14 | 1001 | 0 |
| S15 | 1011 | 1 |

Fig. 13C

| Read Level | Initial value | Parity | Recovered value |
|---|---|---|---|
| RL1 | 1111 | 0 | 1111 |
| RL2 | 1111 | 1 | 1110 |
| RL3 | 1110 | 1 | 1110 |
| RL4 | 1110 | 0 | 1010 |
| RL5 | 1010 | 0 | 1010 |
| RL6 | 1010 | 1 | 1000 |
| RL7 | 1000 | 1 | 1000 |
| RL8 | 1000 | 0 | 1001 |
| RL9 | 1001 | 0 | 1001 |
| RL10 | 1001 | 1 | 0001 |
| RL11 | 0001 | 1 | 0001 |
| RL12 | 0001 | 0 | 0000 |
| RL13 | 0000 | 0 | 0000 |
| RL14 | 0000 | 1 | 0010 |
| | | 1 | 0010 |
| | | 0 | 0110 |
| | | 0 | 0110 |
| | | 1 | 0100 |
| | | 1 | 0100 |
| | | 0 | 1100 |
| | | 0 | 1100 |
| | | 1 | 1101 |
| | | 1 | 1101 |
| | | 0 | 0101 |
| | | 0 | 0101 |
| | | 1 | 0111 |
| | | 1 | 0111 |
| | | 0 | 0011 |
| Remaining | 0011 | 0 | 0011 |
| | | 1 | 1011 |

Fig. 13B

| Distribution | Digital value | Parity |
|---|---|---|
| S0 | 1111 | 0 |
| S1 | 1110 | 1 |
| S2 | 1010 | 0 |
| S3 | 1000 | 1 |
| S4 | 1001 | 0 |
| S5 | 0001 | 1 |
| S6 | 0000 | 0 |
| S7 | 0010 | 1 |
| S8 | 0110 | 0 |
| S9 | 0100 | 1 |
| S10 | 1100 | 0 |
| S11 | 1101 | 1 |
| S12 | 0101 | 0 |
| S13 | 0111 | 1 |
| S14 | 0011 | 0 |
| S15 | 1011 | 1 |

Fig. 13D

| Initial value | | | | Parity (S) | Recovered Value | Logic Operation |
|---|---|---|---|---|---|---|
| T | C | B | A | | | |
| 1 | 1 | 1 | 1 | 0 | 1111 | If T&C&B&A&S then set A=0 |
| 1 | 1 | 1 | 0 | 1 | 1110 | If T&C&B&!A&!S then set C=0 |
| 1 | 0 | 1 | 0 | 0 | 1010 | If T&!C&B&!A&S then set B=0 |
| 1 | 0 | 0 | 0 | 1 | 1000 | If T&!C&!B&!A&!S then set A=1 |
| 1 | 0 | 0 | 1 | 0 | 1001 | If !T&C&B&!A&S then set T=0 |
| 0 | 0 | 0 | 1 | 1 | 0001 | If !T&!C&!B&A&!S then set A=0 |
| 0 | 0 | 0 | 0 | 0 | 0000 | If !T&!C&!B&!A&S then set B=1 |
| 0 | 0 | 1 | 0 | 1 | 0010 | If !T&!C&B&!A&!S then set C=1 |
| 0 | 1 | 1 | 0 | 0 | 0110 | If !T&C&B&!A&S then set B=0 |
| 0 | 1 | 0 | 0 | 1 | 0100 | If !T&C&!B&!A&!S then set T=1 |
| 1 | 1 | 0 | 0 | 0 | 1100 | If T&C&!B&!A&S then set A=1 |
| 1 | 1 | 0 | 1 | 1 | 1101 | If T&C&!B&A&!S then set T=0 |
| 0 | 1 | 0 | 1 | 0 | 0101 | If !T&C&!B&A&S then set B=1 |
| 0 | 1 | 1 | 1 | 1 | 0111 | If !T&C&B&A&!S then set C=0 |
| 0 | 0 | 1 | 1 | 0 | 0011 | If !T&!C&B&A&S then set T=1 |
| 1 | 0 | 1 | 1 | 1 | 1011 | Done |

NONVOLATILE MEMORY WITH ON-CHIP ENCODING FOR FOGGY-FINE PROGRAMMING

CLAIM OF PRIORITY

The present application claims priority from U.S. Provisional Patent Application No. 63/086,732, entitled "NONVOLATILE MEMORY WITH ON-CHIP ENCODING FOR FOGGY-FINE PROGRAMMING," by Gorobets et al., filed Oct. 2, 2020, incorporated by reference herein in its entirety.

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of the NAND string to selectively connect a channel of the NAND string to a source line or bit line. However, various challenges are presented in operating such memory devices.

In some memory structures (e.g. NAND structures) that use charge-storing or charge-trapping material, programming of memory cells may disturb previously-programmed memory cells (e.g. charge added to a memory cell may affect nearby memory cells). To mitigate such program disturb effects, programming may occur in two or more program operations, with neighboring memory cells programmed (at least partially) between program operations. While this approach may mitigate program disturb effects, implementation may require significant data storage capacity to maintain data between program operations (e.g. before data is fully programmed in a NAND structure) and may incur significant overhead (e.g. significant movement of data between components for multiple program operations). Efficiently programming memory cells in multiple program operations may be challenging.

BRIEF DESCRIPTION OF THE DRAWINGS

FIG. 1A is a block diagram of one embodiment of a memory device connected to a host.

FIG. 3A is a block diagram depicting one embodiment of the sense block 51 of FIG. 1.

FIG. 6A depicts an example cross-sectional view of a portion of one of the blocks of FIG. 5.

FIG. 6B depicts an example variation in the width of the memory holes of FIG. 6A along their height.

FIG. 11 illustrates an example of a scheme for foggy-fine programming of word lines in a NAND structure.

FIG. 12 illustrates an example of a mapping of threshold voltage distributions to digital values and parity bits.

FIG. 13B illustrates another example of mapping of threshold voltage distributions to digital values and parity bits.

FIG. 13C illustrates an example of read levels, initial digital values, and parity bits used to obtained recovered values in a foggy read scheme.

FIG. 13D illustrates an example of logic operations used to obtain recovered values in a foggy read scheme.

DETAILED DESCRIPTION

Apparatuses and techniques are described for programming non-volatile memory cells, for example, non-volatile memory cells in a NAND structure. In some cases, non-volatile memory cells are affected by programming of other non-volatile memory cells (e.g. nearby non-volatile memory cells along neighboring word lines). One technique to deal with such effects is to program non-volatile memory cells in two or more program operations, e.g. a first "foggy" program operation that leaves non-volatile memory cells in first distributions that are approximate, followed by a second "fine" program operation that brings the non-volatile memory cells to second distributions that are more accurate (e.g. narrower distributions), which may be used for long term storage. Between such foggy programming and subsequent fine programming, neighboring non-volatile memory cells may be programmed (at least foggy programmed) so that when fine programming occurs, charge is present in neighboring non-volatile memory cells and little or no further disturbance is caused by any further programming of neighboring non-volatile memory cells (e.g. fine programming may add relatively little additional charge so that effects of fine programming are not significant). A safe copy of data (e.g. in DRAM) may be maintained while the data is foggy programmed and not yet fine programmed. However, maintaining such data may require significant space in DRAM or other storage location. Also, accessing such data (to save and subsequently retrieve it) may use significant resources (e.g. may result in significant traffic on a bus between a memory die and DRAM)

In an example, data may be encoded prior to being foggy programmed (e.g. by generating parity data) so that when a read of foggy-programmed memory cells (in first distributions) is performed, the results of that read (a foggy read) may be decoded (e.g. combined with parity data) to recover the original data. In some cases, no safe copy may be needed when data is encoded and is recoverable from foggy-programmed memory cells and parity data. On-chip circuits may be provided to perform such encoding (e.g. XOR circuits) and decoding so that resources are efficiently used and excessive transfer of data (e.g. through memory bus) is avoided. Parity data may be stored on-chip in some cases (e.g. in a portion of a non-volatile memory structure that is configured for Single Level Cell (SLC) storage). In some cases, parity data may be corrected (decoded) by Error Correction Code (ECC) circuits prior to being used for recovery of data. Parity data may also be stored off-chip (e.g. in DRAM).

Figure 1:
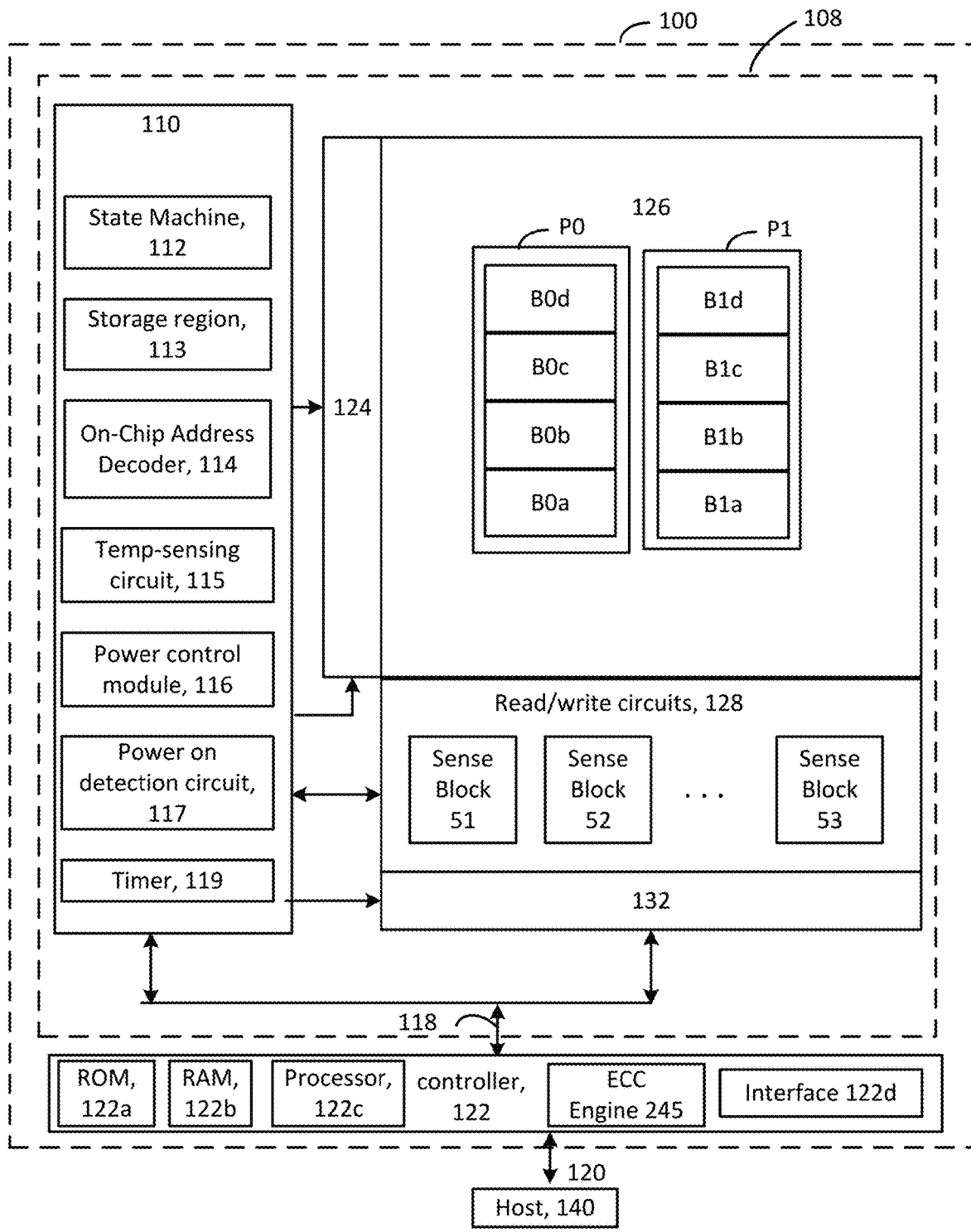
FIG. 1 is a block diagram of an example memory device comprising non-volatile memory cells in blocks.

FIG. 1 is a block diagram of an example memory device comprising memory cells arranged in different planes. The memory device 100, such as a non-volatile storage system, may include one or more memory die 108. The memory die 108 includes a memory structure 126 of memory cells, such as an array of memory cells, control circuit 110, and read/write circuits 128. The memory structure 126 is addressable by word lines via a row decoder 124 and by bit lines via a column decoder 132. The memory structure 126 may comprise multiple planes, such as neighbor planes P0 and P1. Each plane may include one or more blocks of memory cells. For example, P0 includes blocks B0a-B0d and P1 includes blocks B1a-B1d.

The read/write circuits 128 include multiple sense blocks 51, 52, . . . 53 (sensing circuit) and allow a page of memory cells to be read or programmed in parallel. Typically, a controller 122 is included in the same memory device 100 (e.g., a removable storage card or other non-volatile storage apparatus) as the one or more memory die 108. The controller may be separate from the memory die. Commands and data are transferred between the host 140 and controller 122 via an interface such as data bus 120, and between the controller and the one or more memory die 108 via lines 118.

The memory structure 126 can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuit 110 cooperates with the read/write circuits 128 to perform memory operations on the memory structure 126 including read, write and erase, and includes a state machine 112, an on-chip address decoder 114, a temperature-sensing circuit 115, a power control module 116, a power on detection circuit 117 and a timer 119.

The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits). The on-chip address decoder 114 provides an address interface between that used by the host or a memory controller to the hardware address used by the decoders 124 and 132. An indication of temperature which is obtained by the temperature-sensing circuit 115 may be used to adjust a read operation, as described further below.

The power control module 116 controls the power and voltages supplied to the word lines, select gate lines, bit lines and source lines during memory operations. It can include drivers for data and dummy word lines, SGS and SGD transistors and source lines. The sense blocks 51-53 can include bit line drivers, in one approach. The power on detection circuit may be used to detect when the memory device has been powered on. The detection circuit 117 may comprise an event handler which may be a software or firmware routine, or a routine implemented in hardware. The timer 119 may be used to determine a time which has elapsed since a last operation (e.g. read or write operation). The timer 119 may increment based on a clock signal used in the memory device.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuit 110, state machine 112, on-chip address decoder 114, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error correction code (ECC) engine 245. The ECC engine can correct a number of read errors.

A memory interface 122d may also be provided. The memory interface 122d, in communication with ROM 122a, RAM 122b and processor 122c, is an electrical circuit that provides an electrical interface between controller 122 and memory die 108. For example, the memory interface can change the format or timing of signals, provide a buffer, isolate from surges, latch I/O and so forth. The processor 122c can issue commands to the control circuit 110 (or any other component of the memory die) via the memory interface 122d.

The storage device comprises code such as a set of instructions, and the processor is operable to execute the set of instructions to provide the functionality described herein. Alternatively, or additionally, the processor can access code from a storage device of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or memory structure 126 for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure. In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements is formed, or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read, write, and erase operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

While memory device 100 of FIG. 1 is one example of a non-volatile storage apparatus, other examples of non-volatile storage apparatuses may be implemented using the present technology.

FIG. 1A is a block diagram of one embodiment of a memory device 101 connected to host 140 that can implement the technology proposed herein. Memory device 101 may be considered another example of a non-volatile storage apparatus. Many different types of memory devices can be used with the technology proposed herein. One example memory device is a solid-state drive ("SSD"); however, other types of memory devices can also be used. Memory device 101 comprises a controller 102, non-volatile memory 104 for storing data, and local memory 106 (e.g. DRAM. SRAM or ReRAM). In one embodiment, controller 102 comprises a Front End Processor (FEP) circuit 141 and one or more Back End Processor (BEP) circuits 142. In one embodiment FEP circuit 141 is implemented on an ASIC. In one embodiment, each BEP circuit 142 is implemented on a separate ASIC. In another embodiment, the ASICs for each of the BEP circuits 142 and the FEP circuit 141 are implemented on the same semiconductor such that the controller 102 is manufactured as a System on a Chip ("SoC"). FEP circuit 141 and BEP circuit 142 both include their own processors. In one embodiment, FEP circuit 141 and BEP circuit 142 work as a master slave configuration where the FEP circuit 141 is the master and each BEP circuit 142 is a slave. For example, FEP circuit 141 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). BEP circuit 142 manages memory operations in the memory packages/die at the request of FEP circuit 141. For example, the BEP circuit 142 can carry out the read, erase and programming processes. Additionally, the BEP circuit 142 can perform buffer management, set specific voltage levels required by the FEP circuit 141, perform error correction (e.g., generate error correction code (ECC)), control the Toggle Mode interfaces to the memory packages, etc. In one embodiment, each BEP circuit 142 is responsible for its own set of memory packages. Controller 102 is one example of a control circuit.

In one embodiment, non-volatile memory 104 comprises a plurality of memory packages. Each memory package includes one or more memory die. Therefore, controller 102 is connected to one or more non-volatile memory die. In one embodiment, each memory die in the memory packages 104 utilize NAND flash memory (including two-dimensional NAND flash memory and/or three-dimensional NAND flash memory). In other embodiments, the memory package can include other types of memory.

Controller 102 communicates with host 140 via an interface (e.g. a data bus 120). In one embodiment, data bus 120 implements a Universal Flash Storage ("UFS") interface.

Host 140 is configured to run a software application 143 that needs to access (e.g., write to and read from) memory device 101. To access memory device 101, application 143 communicates with driver 144, which is software for enabling communication between application 143 and memory device 101. The software implementing driver 144 can be executed by a microprocessor in host 140. Driver 144 is in communication with a host controller 146 (e.g., a microprocessor and software, or other type of processor) that communicates with memory device 101 via device interface 129. In one embodiment, device interface 129 includes a series of connectors, ports capacitors, etc. for physically connecting to memory device 101. Host controller 146 is also connected to host memory 130, which is the host's physical memory and can be DRAM, SRAM, non-volatile memory or another type of storage. Host 140 is external to and separate from memory device 101. In one embodiment, memory device 101 is embedded in host 140. In some embodiments, memory device 101 is not embedded in host 140, but is connected to host 140.

Host 140 is one example of an entity that is external to memory device 101. Other examples of an entity that is external to memory device 101 include other computing devices (e.g., computers, servers, smart appliances, smart phones, etc.) that are connected to memory device 101 and other computing systems that are in communication with memory device 101 via any communication means (e.g., LAN, WAN, WiFi, wired connection, wireless connection, direct connection, indirect connection, etc.)

Figure 1B:
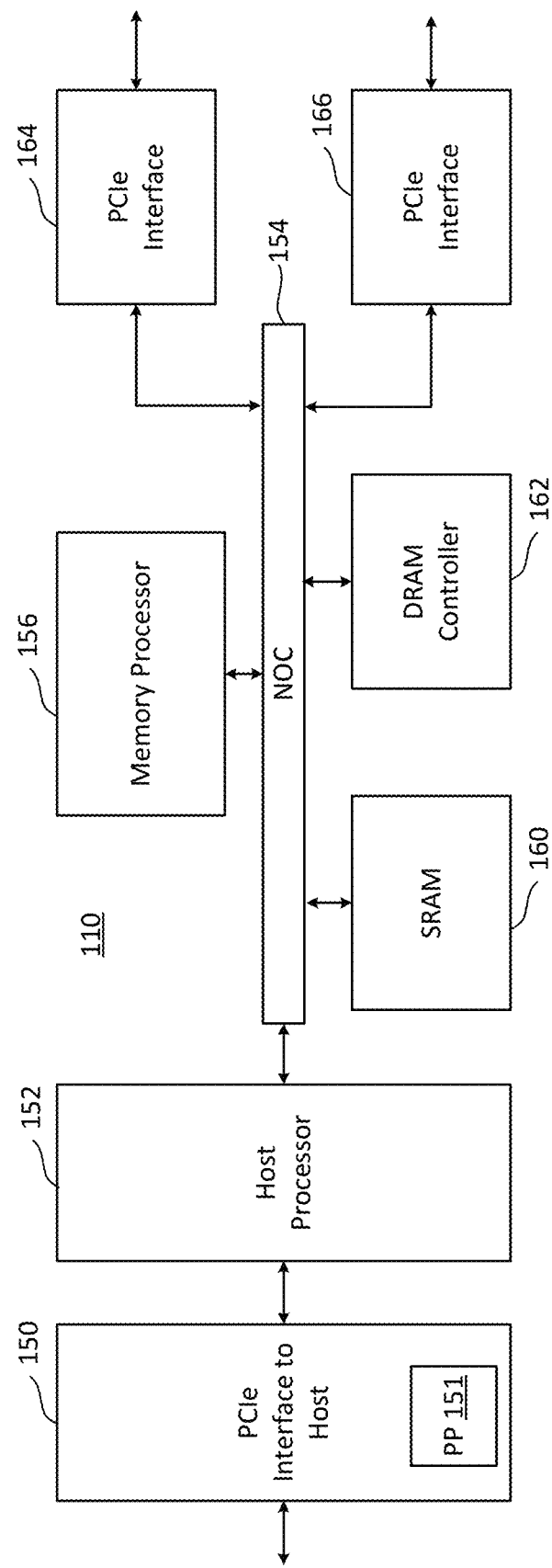
FIG. 1B is a block diagram of one embodiment of a Front End Processor Circuit. In some embodiments, the Front End Processor Circuit is part of a controller.

FIG. 1B is a block diagram of one embodiment of FEP circuit 141. FIG. 1B shows a PCIe interface 150 to communicate with host 140 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is memory processor 156, SRAM 160 and DRAM controller 162. The DRAM controller 162 is used to operate and communicate with the DRAM (e.g., local memory 106). SRAM 160 is local RAM memory used by memory processor 156. Memory processor 156 is used to run the FEP circuit and perform the various memory operations. Also, in communication with the NOC are two PCIe Interfaces 164 and 166. In the embodiment of FIG. 1B, the SSD controller will include two BEP circuits 142; therefore, there are two PCIe Interfaces 164/166. Each PCIe Interface communicates with one of the BEP circuits 142. In other embodiments, there can be more or less than two BEP circuits 142; therefore, there can be more than two PCIe Interfaces.

Figure 1C:
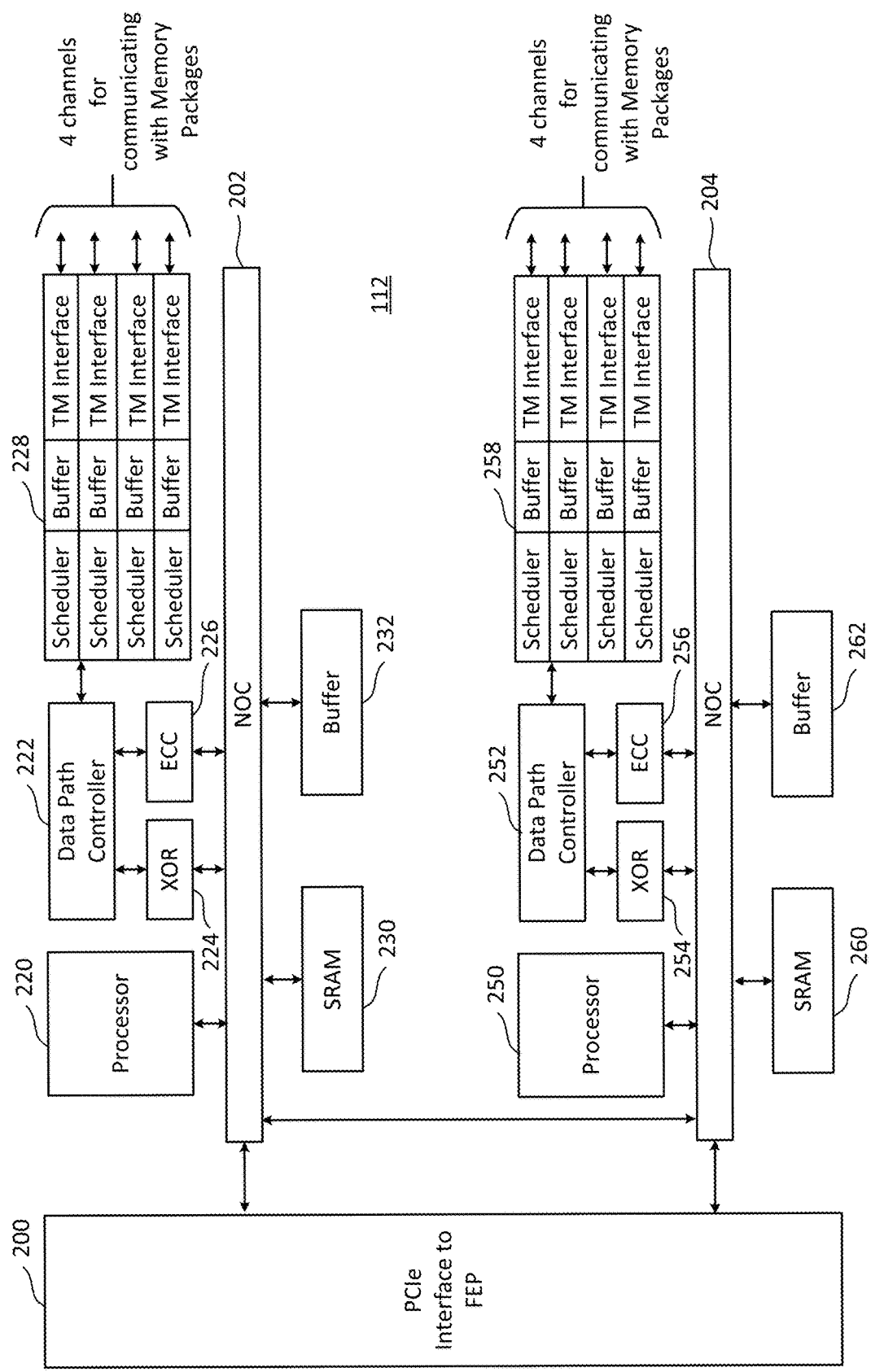
FIG. 1C is a block diagram of one embodiment of a Back End Processor Circuit. In some embodiments, the Back End Processor Circuit is part of a controller.

FIG. 1C is a block diagram of one embodiment of the BEP circuit 142. FIG. 1C shows a PCIe Interface 200 for communicating with the FEP circuit 141 (e.g., communicating with one of PCIe Interfaces 164 and 166 of FIG. 2). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art (e.g., encoding data to be written and decoding data that is read). The XOR engines 224/254 are used to XOR the data so that data can be combined (e.g. combine data) and stored in a manner that can be recovered in case there is a programming error. Data path controller 22 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 1D:
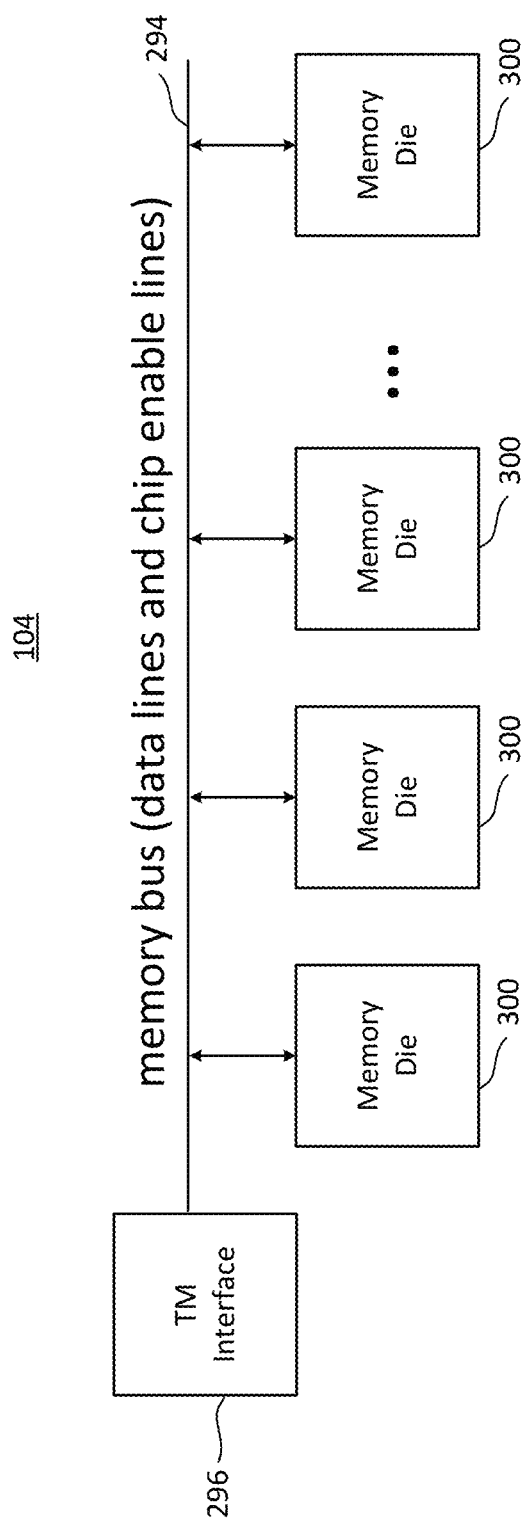
FIG. 1D is a block diagram of one embodiment of a memory package.

FIG. 1D is a block diagram of one embodiment of a memory package 104 that includes a plurality of memory die 300 connected to a memory bus 294 (command lines, data lines and chip enable lines). The memory bus 294 connects to a Toggle Mode Interface 296 for communicating with the TM Interface of a BEP circuit 142 (see e.g. FIG. 1C). In some embodiments, the memory package can include a small controller connected to the memory bus and the TM Interface. The memory package can have one or more memory die. In one embodiment, each memory package includes eight or sixteen memory die; however, other numbers of memory die can also be implemented. The technology described herein is not limited to any particular number of memory die.

FIGS. 1A-D provide one example architecture of a controller. However, the technology described herein is not limited to any specific form of the controller. Therefore, other architectures can be utilized for the controller. For example, other embodiments of a controller include microprocessors, microcontrollers, state machine, etc. in other configurations. In some cases, the controller can be inside the host. In other cases, the controller can be implemented on the memory die. Other options/configurations can also be used. A controller can also be referred to as a processor, even if it includes multiple processing cores, as the controller operates as a processor for the memory device.

Figure 2:
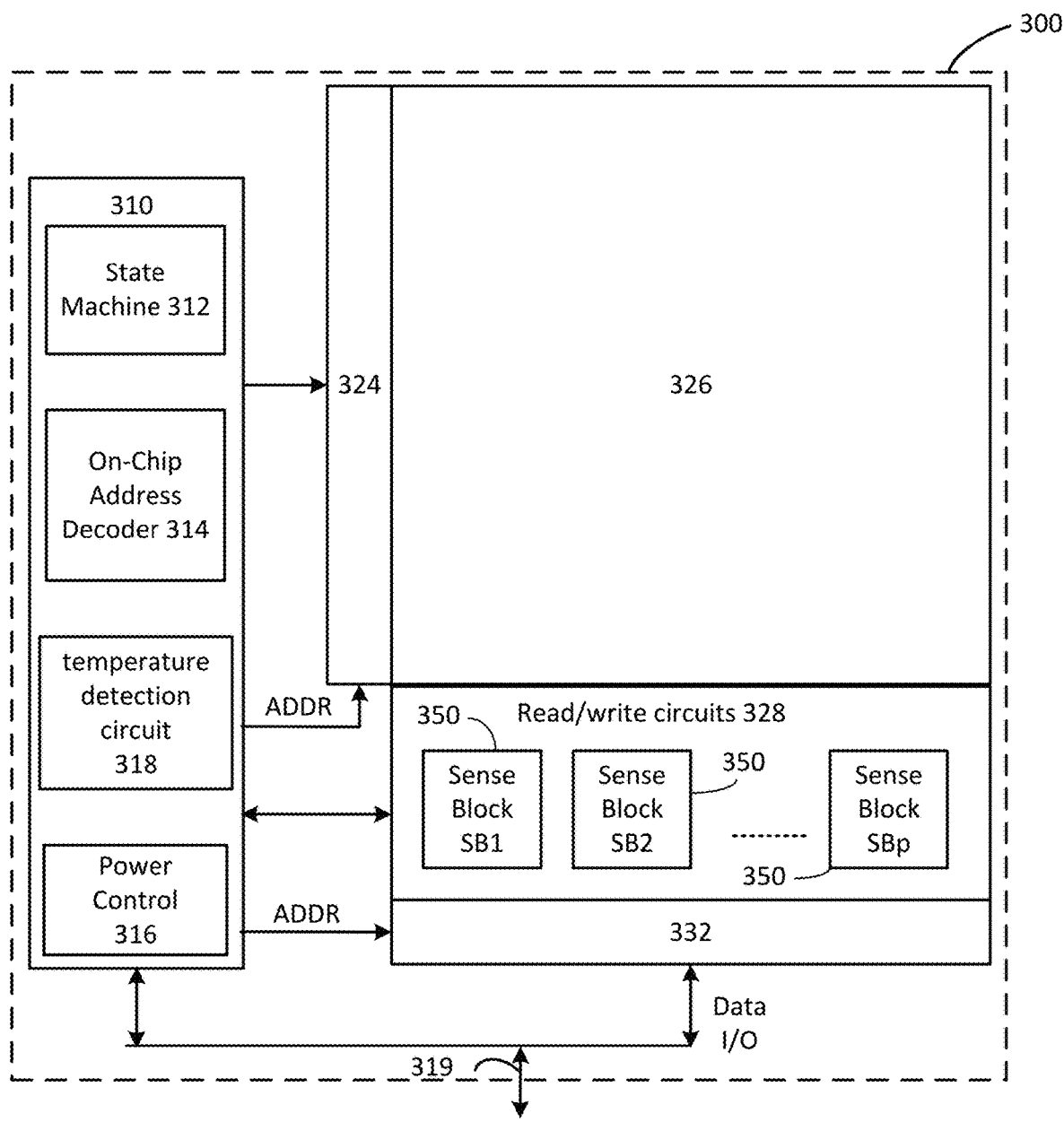
FIG. 2 is a block diagram of one embodiment of a memory die.

FIG. 2 is a functional block diagram of one embodiment of a memory die 300. Each of the one or more memory die 300 of FIG. 1D can be implemented as memory die 300 of FIG. 2. The components depicted in FIG. 2 are electrical circuits. In one embodiment, each memory die 300 includes a memory structure 326, control circuit 310, and read/write circuits 328, all of which are electrical circuits. Memory structure 326 is addressable by word lines via a row decoder 324 and by bit lines via a column decoder 332. The read/write circuits 328 include multiple sense blocks 350 including SB1, SB2, SBp (sensing circuit) and allow a page (or multiple pages) of data in multiple memory cells to be read or programmed in parallel. In one embodiment, each sense block includes a sense amplifier and a set of latches connected to the bit line. The latches store data to be written and/or data that has been read. The sense blocks include bit line drivers.

Commands and data are transferred between the controller 102 and the memory die 300 via lines 319. In one embodiment, memory die 300 includes a set of input and/or output (I/O) pins that connect to lines 118.

Control circuit 310 cooperates with the read/write circuits 328 to perform memory operations (e.g., write, read, erase, and others) on memory structure 326. In one embodiment, control circuit 310 includes a state machine 312, an on-chip address decoder 314, a power control circuit 316 and a temperature detection circuit 318. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced or augmented by a microcontroller or microprocessor. In one embodiment, control circuit 310 includes buffers such as registers, ROM fuses and other storage devices for storing default values such as base voltages and other parameters.

The on-chip address decoder 314 provides an address interface between addresses used by controller 102 to the hardware address used by the decoders 324 and 332. Power control module 316 controls the power and voltages supplied to the word lines and bit lines during memory operations. Power control module 316 may include charge pumps for creating voltages.

For purposes of this document, control circuit 310, alone or in combination with read/write circuits 328 and decoders 324/332, comprise a control circuit connected to memory structure 326. This control circuit is an electrical circuit that performs the functions described below in the flow charts. In other embodiments, the control circuit can consist only of controller 102, which is an electrical circuit in combination with software (e.g., firmware), that performs the functions described below in the flow charts. In another alternative, the control circuit comprises controller 102 and control circuit 310 performing the functions described below in the flow charts. In another embodiment, the control circuit comprises state machine 312 (and/or a microcontroller and/or microprocessor) alone or in combination with controller 102. In another alternative, the control circuit comprises controller 102, control circuit 310, read/write circuits 328 and decoders 324/332 performing the functions described below in the flow charts. In other embodiments, the control circuit comprises one or more electrical circuits that operate non-volatile memory.

In one embodiment, memory structure 326 comprises a monolithic three-dimensional memory array of non-volatile memory cells in which multiple memory levels are formed above a single substrate. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. In another embodiment, memory structure 326 comprises a two-dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

In one embodiment, the control circuit(s) are formed on a first die, referred to as a control die, and the memory array is formed on a second die, referred to as a memory die. For example, some or all control circuits (e.g. control circuit 310, row decoder 324, column decoder 332, and read/write circuits 328) associated with a memory may be formed on the same control die. A control die may be bonded to one or more corresponding memory die to form an integrated memory assembly. The control die and the memory die may have bond pads arranged for electrical connection to each other. Bond pads of the control die and the memory die may be aligned and bonded together by any of a variety of bonding techniques, depending in part on bond pad size and bond pad spacing (i.e., bond pad pitch). In some embodiments, the bond pads are bonded directly to each other, without solder or other added material, in a so-called Cu-to-Cu bonding process. In some examples, dies are bonded in a one-to-one arrangement (e.g. one control die to one memory die). In some examples, there may be more than one control die and/or more than one memory die in an integrated memory assembly. In some embodiments, an integrated memory assembly includes a stack of multiple control die and/or multiple memory die. In some embodiments, the control die is connected to, or otherwise in communication with, a memory controller. For example, a memory controller may receive data to be programmed into a memory array. The memory controller will forward that data to the control die so that the control die can program that data into the memory array on the memory die.

FIG. 3A is a block diagram depicting one embodiment of the sense block 51 of FIG. 1 or sense block 350 of FIG. 2. An individual sense block 51 is partitioned into one or more core portions, referred to as sense circuits 180-183 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements.

The sense circuit 180, as an example, comprises sense circuit 170 that performs sensing by determining whether a conduction current in a connected bit line is above or below a predetermined threshold level. Sense circuit 180 also includes a bit line latch 184 that is used to set a voltage condition on the connected bit line. For example, a predetermined state latched in the bit line latch will result in the connected bit line being pulled to a state designating program inhibit (e.g., 1.5-3 V). As an example, a flag=0 can inhibit programming, while flag=1 does not inhibit programming.

The managing circuit 190 comprises a processor 192, four example sets of data latches 194-197 and an I/O interface 196 coupled between the set of data latches 194 and data bus 120. One set of data latches, e.g., T, C, B, A, can be provided for each sense circuit. In some cases, additional data latches may be used. Each set of latches T, C, B, A may correspond to a different logical page of data for programming together to a set of non-volatile memory cells. This is in a sixteen-level or four-bit per storage element memory device. One additional data latch per bit line can be provided for each additional data bit per storage element.

The processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading and verifying, the operation of the system is under the control of state machine 112 that controls the supply of different control gate voltages to the addressed storage element. As it steps through the various predefined control gate voltages corresponding to the various memory states supported by the memory, the sense circuit 180 may trip at one of these voltages and a corresponding output will be provided from sense circuit 180 to processor 192 via bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197. In another embodiment of the managing circuit 190, bit line latch serves double duty, both as a latch for latching the output of the sense circuit 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. In a four-bit per storage element implementation (Quad-Level Cell or QLC), four data latches (T, C, B, A) may be used. The program operation, under the control of the state machine, comprises a series of programming voltage pulses applied to the control gates of the addressed storage elements. Each program voltage is followed by a read back (verify) to determine if the storage element has been programmed to the desired memory state. In some cases, processor 192 monitors the read back memory state relative to the desired memory state. When the two are in agreement, the processor 192 sets the bit line latch so as to cause the bit line to be pulled to a state designating program inhibit. This inhibits the storage element coupled to the bit line from further programming even if program pulses appear on its control gate. In other embodiments the processor initially loads the bit line latch and the sense circuit sets it to an inhibit value during the verify process.

Each set of data latches 194-197 may be implemented as a stack of data latches for each sense circuit. In one embodiment, there are four or more data latches per sense circuit 180. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated storage element has reached certain mileposts in a program operation. For example, latches may identify that a storage element's Vth is below a particular verify level. The data latches indicate whether a storage element currently stores one or more bits from a page of data.

Figure 3B:
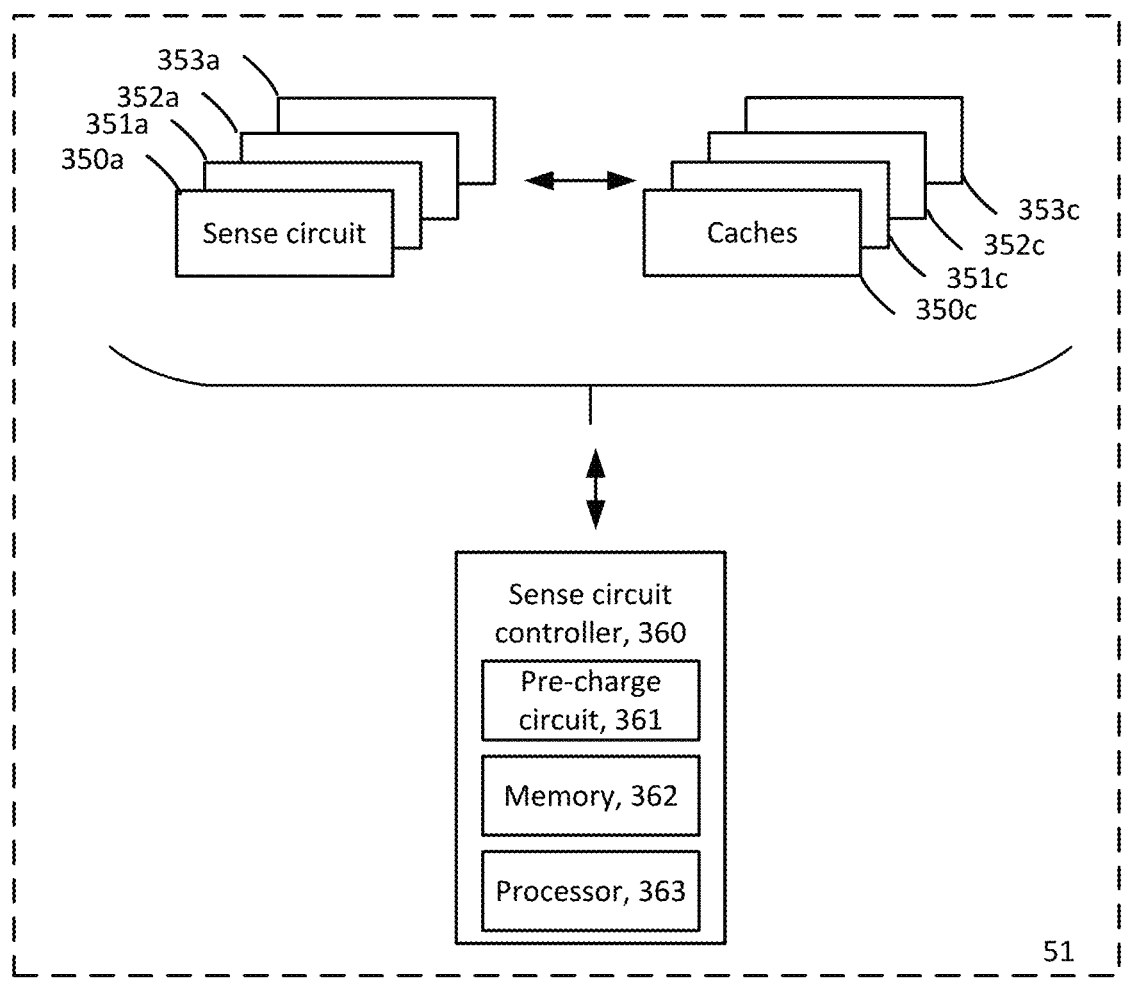
FIG. 3B depicts another example block diagram of the sense block 51 of FIG. 1.

FIG. 3B depicts another example block diagram of the sense block 51 of FIG. 1 or sense block 350 of FIG. 2. The column control circuitry can include multiple sense blocks, where each sense block performs sensing, e.g., read, program verify, or erase verify operations for multiple memory cells via respective bit lines. In one approach, a sense block comprises multiple sense circuits, also referred to as sense amplifiers. Each sense circuit is associated with data latches and caches. For example, the example sense circuits 350*a*, 351*a*, 352*a* and 353*a* are associated with caches 350*c*, 351*c*, 352*c* and 353*c*, respectively.

In one approach, different subsets of bit lines can be sensed using different respective sense blocks. This allows the processing load which is associated with the sense circuits to be divided up and handled by a respective processor in each sense block. For example, a sense circuit controller 360 can communicate with the set, e.g., sixteen, of sense circuits and latches. The sense circuit controller may include a pre-charge circuit 361 which provides a voltage to each sense circuit for setting a pre-charge voltage. The sense circuit controller may also include a memory 362 and a processor 363.

Figure 4:
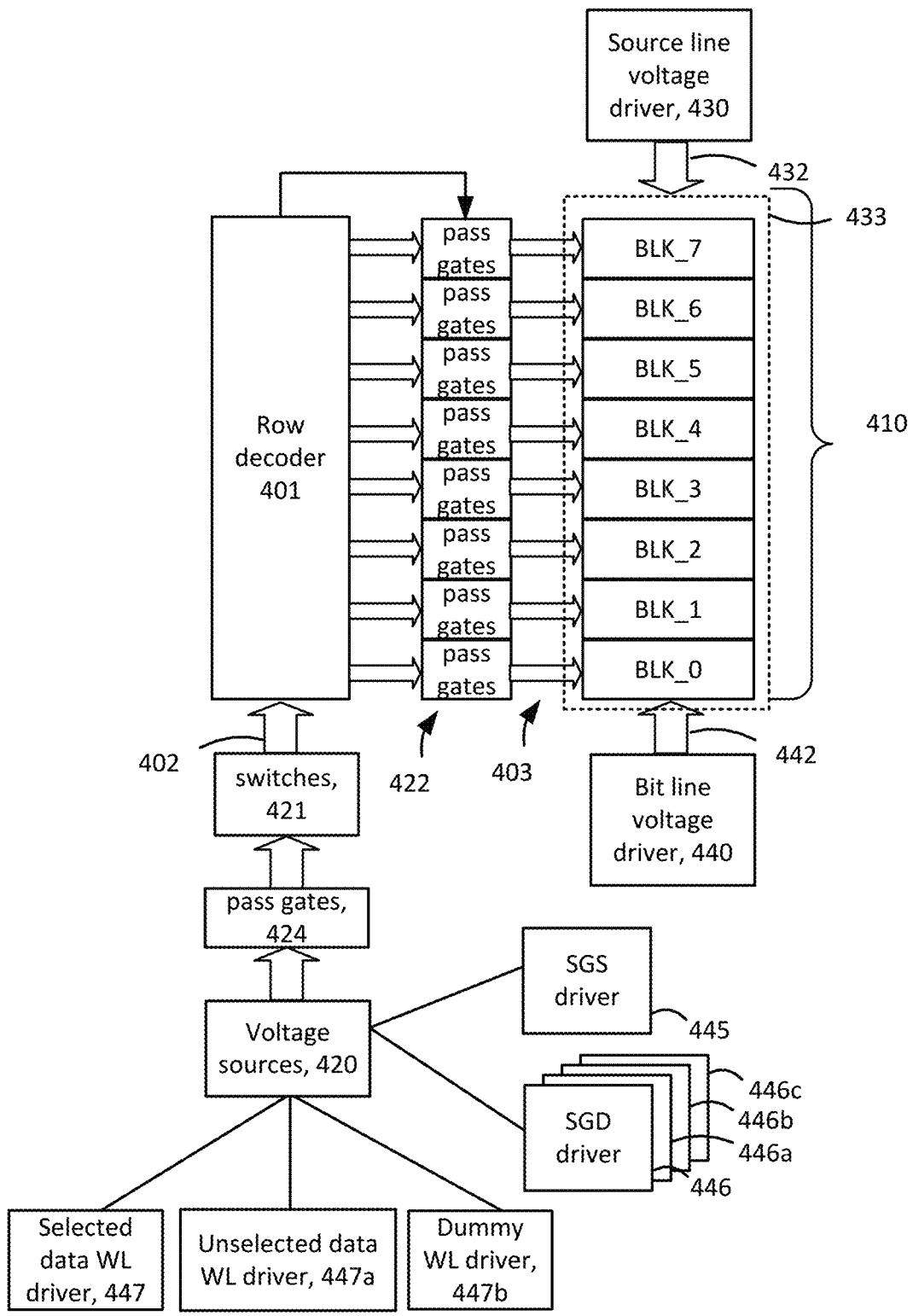
FIG. 4 depicts an example circuit for providing voltages to blocks of memory cells.

FIG. 4 depicts an example circuit for providing voltages to blocks of memory cells. In this example, a row decoder 401 provides voltages to word lines and select gates of each block in set of blocks 410. The blocks could be in a plane and includes blocks BLK_0 to BLK_7. The row decoder provides a control signal to pass transistors 422 which connect the blocks to the row decoder. Typically, program or read operations are performed on one selected block at a time and on one selected sub-block of the block. An erase operation may be performed on a selected block or sub-block. The row decoder and pass gates can connect global control lines 402 to local control lines 403. The control lines represent conductive paths. Voltages are provided on the global control lines from voltage sources 420 to pass transistors 422. The voltage sources may provide voltages to switches 421 which connect to the global control lines. Pass transistors 424 are controlled to pass voltages from the voltage sources 420 to the switches 421.

The voltage sources 420 can provide voltages on word lines (WL), SGS control gates and SGD control gates, for example. The voltage sources can include a selected word line (WL) driver 447, which provides a voltage on a word line selected during a program or read operation, a driver 447*a* for unselected data word lines, and a dummy word line driver 447*b* which provides voltages on dummy word lines.

The voltage sources can also include a common SGS driver 445 and separate SGD drivers for each sub-block. For example, SGD drivers 446, 446*a*, 446*b* and 446*c* can be provided for SB0, SB1, SB2 and SB3, respectively. In another option, a separate SGS driver is provided for each sub-block.

The various components, including the row decoder, may receive commands from a controller such as the state machine 112 or the controller 122 to perform the functions described herein.

A source line voltage source 430 provides the voltage Vsl to the source lines/diffusion region in the substrate via control lines 432. In one approach, the source diffusion region 433 is common to the blocks. A set of bit lines 442 is also shared by the blocks. A bit line voltage source 440 provides voltages to the bit lines.

Figure 5:
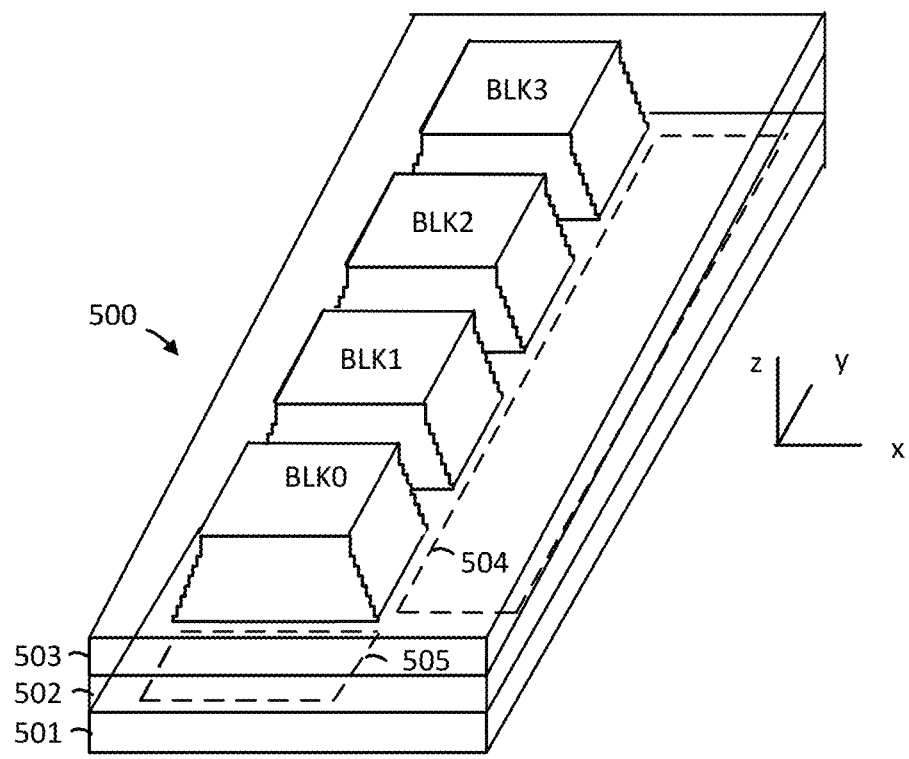
FIG. 5 is a perspective view of a memory device 500 comprising a set of blocks in an example 3D configuration of the memory structure 126 of FIG. 1.

FIG. 5 is a perspective view of a memory device 500 comprising a set of blocks in an example 3D configuration of the memory structure 126 of FIG. 1 or memory structure 326 of FIG. 2. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The pass transistors for a voltage driver of the SGS transistors may be located in this peripheral area 505, in one approach.

In this case, the blocks BLK0, BLK1, BLK2 and BLK3 are at progressively further distances from the pass transistors. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 6C:
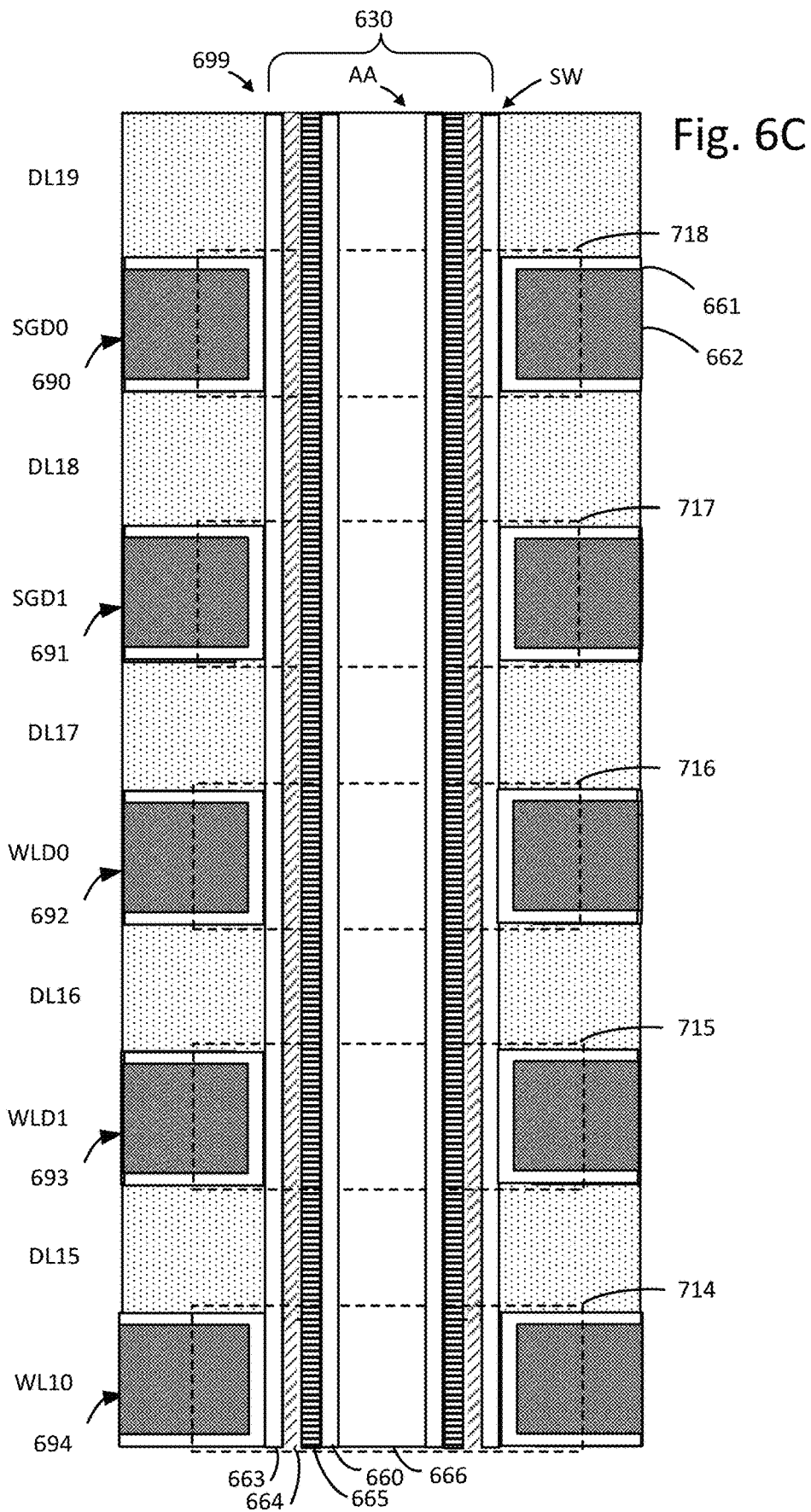
FIG. 6C depicts a close-up view of the region 622 of the stack of FIG. 6A.

FIG. 6A depicts an example cross-sectional view of a portion of one of the blocks of FIG. 5. The block comprises a stack 610 of alternating conductive and dielectric layers. In this example, the conductive layers comprise two SGD layers, one SGS layer, two source-side dummy word line layers (or word lines) WLS1 and WLS0, two drain-side dummy word line layers WLD1 and WLD0, and eleven data word line layers (or data word lines) WL0-WL10. WL0 is a source-side data word line and WLS1 is a dummy word line layer which is adjacent to the source-side data word line. WLS0 is another dummy word line layer which is adjacent to WLS1. WL10 is a drain-side data word line and WLD1 is a dummy word line layer which is adjacent to the drain-side data word line. WLD0 is another dummy word line layer which is adjacent to WLD1. The dielectric layers are labelled as DL1-DL19. Further, regions of the stack which comprise NAND strings NS1 and NS2 are depicted. Each NAND string encompasses a memory hole 618 or 619 which is filled with materials which form memory cells adjacent to the word lines. Region 622 of the stack is shown in greater detail in FIG. 6C.

The stack includes a substrate 611. In one approach, a portion of the source line SL comprises an n-type source diffusion layer 611a in the substrate which is in contact with a source end of each string of memory cells in a block. An erase voltage may be applied to this layer in an erase operation The n-type source diffusion layer 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NS1 has a source-end 613 at a bottom 616b of the stack 616 and a drain-end 615 at a top 616a of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

FIG. 6B depicts an example variation in the width of the memory holes of FIG. 6A along their height. Due to the etching process used to create the memory holes, and the very high aspect ratio, the cross-sectional width, e.g., diameter, of a memory hole can vary along its height. Typically, the diameter becomes progressively smaller from the top to the bottom of the memory hole. In some case, a slight narrowing occurs at the top of the hole, as depicted, so that the diameter becomes slight wider before becoming progressively smaller from the top to the bottom of the memory hole.

FIG. 6C depicts a close-up view of the region 622 of the stack of FIG. 6A. Memory cells are formed at the different levels of the stack at the intersection of a word line layer and a memory hole. In this example, SGD transistors 718 and 717 are provided above dummy memory cells 716 and 715 and a data memory cell 714. A number of layers can be deposited along the sidewall (SW) of the memory hole 630 and/or within each word line layer, e.g., using atomic layer deposition. For example, each pillar 699 or column which is formed by the materials within a memory hole can include a blocking oxide layer 663, a charge-trapping layer 664 or film such as silicon nitride (Si3N4) or other nitride, a tunneling layer 665, a channel 660 (e.g., comprising polysilicon), and a dielectric core 666. A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string comprises a channel which extends continuously from one or more source-end select gate transistors to one or more drain-end select gate transistors.

Figure 7:
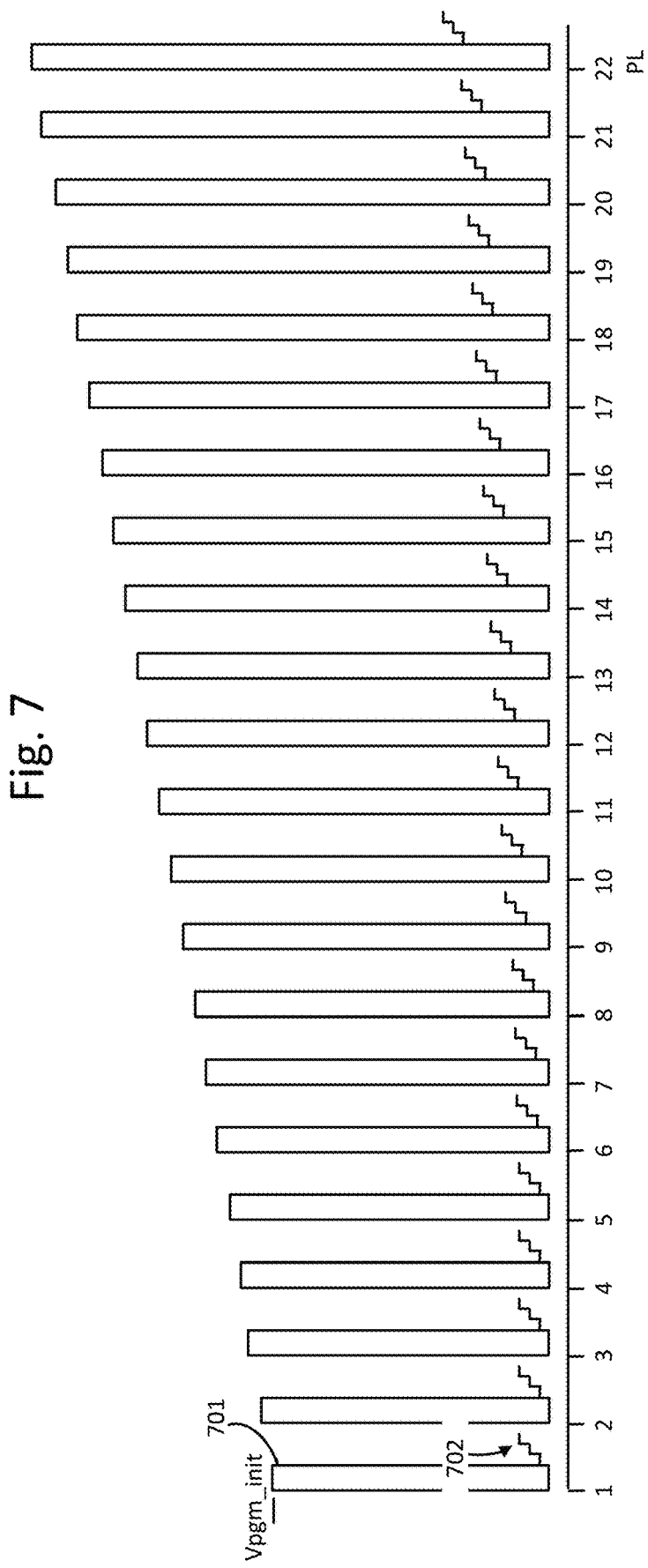
FIG. 7 depicts an example of programming pulses in a program operation.

FIG. 7 depicts a voltage signal used in a series of program loops in an example program operation. The horizontal axis denotes a program loop (PL) number, ranging from 1-22, and the vertical axis denotes voltage. During a program operation, program loops are performed for a selected word line in a selected block in each plane. A program loop comprises a program portion in which a program voltage or pulse is applied to the selected word line followed by a verify portion in which a verify signal is applied to the selected word line while one or more verify tests are performed for the associated memory cells. Other than the erased state, each assigned state has a verify voltage which is used in the verify test for the state in a program operation.

The voltage signal 700 includes a series of program voltages, including an initial program voltage 701, which are applied to a word line selected for programming. In this example, the voltage signal includes program voltages which increase stepwise in amplitude in one or more program loops of a programming pass using a fixed or varying step size. This is referred to as incremental step pulse programming, where the program voltage starts at an initial level Vpgm_int (see initial program voltage 701) and increases in a step in each successive program loop, for instance, until the program operation is completed. A successful completion occurs when the threshold voltages of the selected memory cells reach the verify voltages of the assigned data states.

A program operation can include a single programming pass or multiple programming passes, where each pass uses incremental step pulse programming, for instance.

The verify signal in each program loop, including example verify signal 702, can include one or more verify voltages, based on the assigned data states which are being verified for the program loop. The verify tests can encompass lower assigned data states and then midrange assigned data states and then higher assigned data states as the program operations proceeds. The example verify signals depict three verify voltages as a simplification.

All memory cells may initially be in the erased state at the beginning of the program operation, for instance. After the program operation is completed, the data can be read from the memory cells using read voltages which are between the Vth distributions. At the same time, a read pass voltage, Vpass (e.g., 8-10 V), also referred to as pass voltage, is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two logical pages of data can be stored together in a page. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. An example encoding of bits for the Er, A, B, C, D, E, F and G states is 111, 110, 100, 000, 010, 011, 001 and 101, respectively. Memories that store more than one bit per cell may be referred to as Multi-Level Cell (MLC) memory, which includes Three Level Cell (TLC) memory (storing three bits per cell using eight data states) and Quad Level Cell (QLC) memory (storing four bits per cell using sixteen data states). Memories that store one bit per cell using two data states may be referred to as Single Level Cell (SLC) memory.

Figure 8:
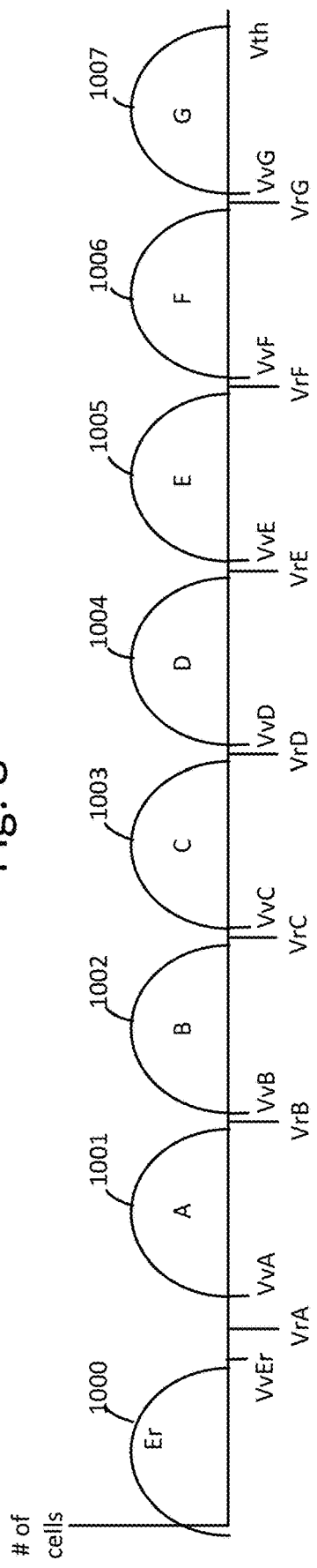
FIG. 8 depicts an example of memory cell threshold voltages of a plurality of memory cells programmed to different data states to store data.

FIG. 8 depicts an example Vth distribution of sets of memory cells after a program operation in a set of memory cells with eight data states, or three bits per cell. The vertical axis depicts a number of memory cells, on a logarithmic scale, and the horizontal axis depicts a Vth of the memory cells on a linear scale. In one approach, at a start of the program operation, the memory cells are all initially in the erased state 1000. After the program operation is successfully completed, the memory cells assigned to the Er state may be upshifted due to some amount of program disturb which normally occurs.

The memory cells which are to be programmed to the A, B, C, D, E, F and G states using verify voltages of VvA, VvB, VvC, VvD, VvE, VvF and VvG, respectively, are represented by the Vth distributions 1001, 1002, 1003, 1004, 1005, 1006 and 1007, respectively. Read voltages VrA, VrB, VrC, VrD, VrE, VrF and VrG can be used for reading the states of the memory cells in a read operation. These verify voltages and read voltages are examples of control gate read levels of the selected word line voltage.

After data is stored for some time in memory cells, the data may become obsolete, may be copied to another location, or for some other reason it may be desirable to erase the memory cells. In many non-volatile memory designs, erase is performed on a block-by-block basis. A subset of memory cells within a block may not be separately erased in such a design (block-erasable memory) so that a block may be considered the minimum unit of erase.

Figure 9:
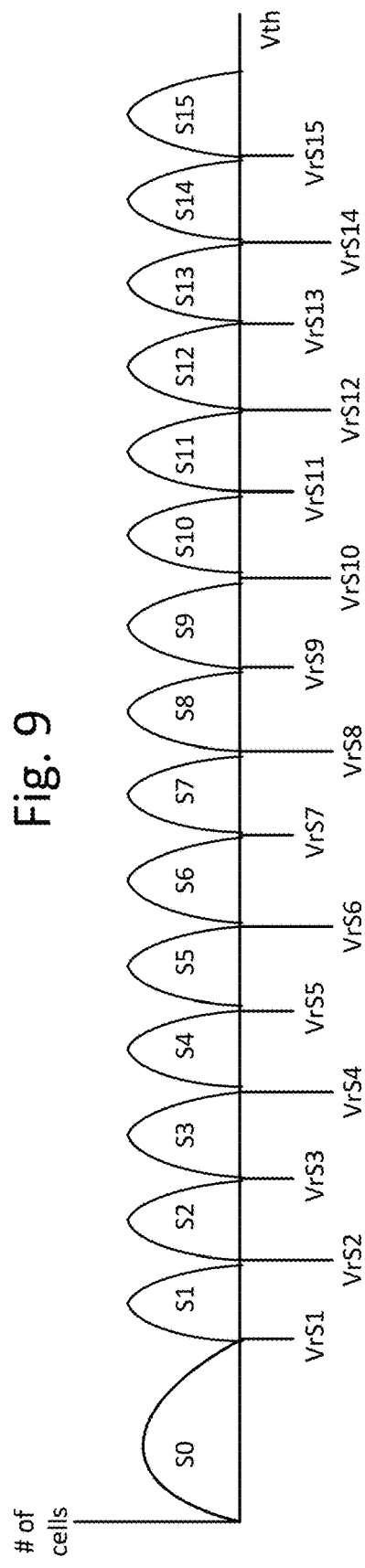
FIG. 9 shows another example of memory cell threshold voltages of a plurality of memory cells programmed to different data states to store data.

FIG. 9 shows another example Vth distribution of memory cells after a program operation in a set of memory cells with sixteen data states, or four bits per cell (QLC memory). The vertical axis depicts a number of memory cells, on a logarithmic scale, and the horizontal axis depicts a Vth of the memory cells on a linear scale. In one approach, at a start of the program operation, the memory cells are all initially in the erased distribution S0. Read voltages VrS1 to VrS15 are illustrated for corresponding distributions S1 to S15 (corresponding verify voltages are not shown in FIG. 9 for clarity).

In the examples of FIGS. 8-9, programming may be performed in a single continuous operation starting with all memory cells in the erased distribution (Er or S0) and ending with all or substantially all memory cells verified as being in their target distributions according to data to be stored. In other examples, programming to the states illustrated in FIGS. 8-9 may occur in two or more separate programming operations that may be performed at different times. Other operations may be performed between such programming operations.

In some cases, programming of one or more memory cells may affect threshold voltage distributions of previously programmed memory cells. For example, programmed memory cells along a word line of a NAND structure may be affected by programming of subsequent word lines of the NAND structure (e.g. programming of memory cells along an adjacent word line in the same block). When charge is added to nearby memory cells, the threshold voltages of previously programmed memory cells may increase so that threshold voltage distributions change in what may be referred to as "program disturb." This may cause misreading of data. In order to reduce such program disturb effects, programming may be performed in two or more operations to allow programming of adjacent memory cells before programming is finalized. For example, a first programming operation may program a group of memory cells to first distributions that are close to the final distributions in what may be referred to as a foggy programming operation. Then, memory cells of one or more neighboring word line may be programmed. Subsequently, after the neighboring cells are programmed, another program operation (fine programming operation) may program the group of memory cells to second distributions (e.g. final distributions like those shown in FIGS. 8-9). Programming to first (approximate or foggy) distributions and subsequently programming to second (accurate or fine) distributions in this way may be referred to as foggy-fine programming.

Figure 10:
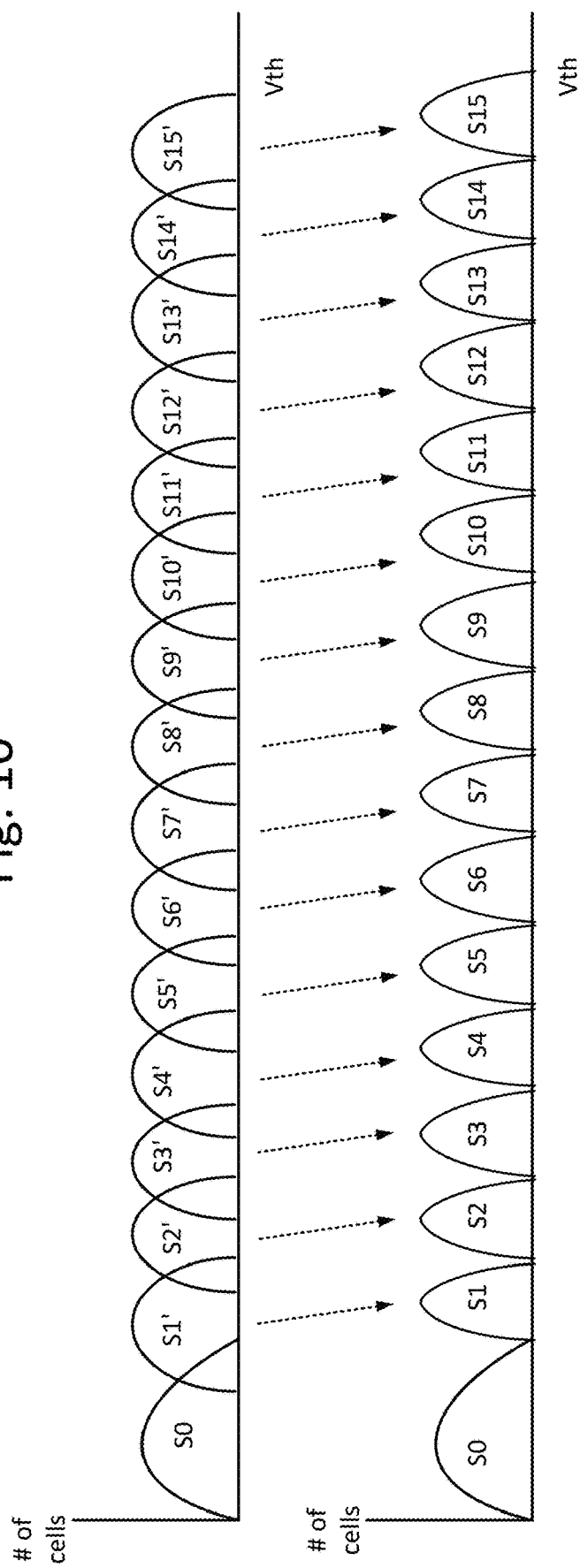
FIG. 10 illustrates an example of foggy programming followed by fine programming.

FIG. 10 illustrates an example of foggy-fine programming of a group of QLC memory cells using sixteen distributions corresponding to sixteen data states. All memory cells may be in an erased distribution (e.g. distribution S0) prior to foggy programming. Foggy programming programs memory cells to the first distributions S1' to S15' shown on the top of FIG. 10. Fine programming subsequently programs the memory cells to the second distributions S1 to S15 shown on the bottom. There may be some time between these two program operations and one or more other groups of memory cells may be programmed during that time. It will be understood that memory cells of a given first distribution are subsequently further programmed to a corresponding second distribution without erasing memory cells between so that fine programming does not start from the erased distribution. For example, memory cells that are programmed to the S1' distribution in a foggy program operation are subsequently further programmed to the S1 distribution in a fine program operation, memory cells that are programmed to the S2' distribution in a foggy program operation are subsequently further programmed to the S2 distribution in a fine program operation, memory cells that are programmed to the S3' distribution in a foggy program operation are subsequently further programmed to the S3 distribution in a fine program operation, and so on.

First distributions S1' to S15' are generally wider than second distributions S1-S15 and there is significant overlap between adjacent distributions (e.g. distribution S1' overlaps distribution S2', distribution S2' overlaps distribution S3' and so on). Programming to first distributions may use the same programming steps as used for second distributions or may use different steps (e.g. programming pulses of the same voltage and time or different voltage and/or time). Reading memory cells that are in the first distributions S1' to S15' using read voltages as shown in FIG. 9 may provide a large number of errors (e.g. more errors that can be corrected by ECC) because of such overlaps so that another source may be used for fine programming. A safe copy of the data may be maintained in another location between foggy program and fine program operations so that a good copy is available for fine programming. For example, a copy of the data may be written in additional non-volatile memory cells (e.g. in SLC memory cells, which may be in the same memory structure as the QLC memory cells, or elsewhere) or in a volatile memory for subsequent fine programming.

Between foggy programming and fine programming of a given word line, one or more other word lines (e.g. nearby word lines that may have some coupling with the given word line) may be programmed. FIG. 11 shows an example of a programming scheme that may be used to program word lines of four strings of a 3D NAND structure (e.g. NAND strings such as NS1 and NS2 illustrated in FIG. 6A). The first column on the left indicates that word line (WL) and the next column (STAGE) indicates the programming stage as either FOGGY or FINE for each of the four strings STR0 to STR3. Numbers at each entry indicate the order of foggy and fine programming of different strings and word lines. Arrows are used to indicate order of some steps.

Programming starts with foggy programming of WL 0 of STR0, STR1, STR2 and STR3, followed by foggy programming of WL 1, STR0, and then fine programming of WL 0, STR0. This is followed by foggy programming WL1, STR1, then fine programming WL0, STR1, foggy programming WL1, STR2, fine programming WL0, STR2, foggy programming WL1, STR3, fine programming WL0, STR3, followed by foggy programming of WL2, STR0, and so on. It can be seen that between foggy programming and fine programming of a given group of memory cells, other memory cells are programmed (e.g. foggy programmed) so that fine programming occurs after coupling effects of neighboring cells are already in place and thus program disturb effects are reduced. For example, while foggy programming of WL1, STR0 is the fourth program operation in FIG. 11, fine programming of WL1, STR0 is the thirteenth program operation so that nine other program operations occur in between. A copy of data that is foggy programmed and has not yet been fine programmed may be saved in a safe location until fine programming is complete (e.g. a safe copy of data for WL1, STR0 may be maintained between the fourth and thirteenth operations of FIG. 11). Maintaining a safe copy may take significant resources both in terms of storage space (e.g. in volatile or non-volatile memory) and in terms of bus usage to transfer the data.

In an example of the present technology, parity data may be calculated for data to be stored in MLC memory cells and this parity data may allow data that has been foggy programmed to be recovered (e.g. recovered by combining the results of reading foggy data with the parity data to obtain the original data without requiring a safe copy).

FIG. 12 illustrates an example of a gray code memory state encoding scheme used with parity data to facilitate recovery of data from memory cells that are foggy programmed. The encoding scheme illustrated may be applied to distributions shown in any of FIGS. 8-10. Distributions S0 to S15 (column 1) are each assigned a different four-bit digital value (column 2), or memory state, according to a grey code assignment scheme so that digital values assigned to any adjacent distributions differ by only one bit. For example, the digital values assigned to distribution S4 (1100) and neighboring distribution S3 (1101) have the first three bits the same (110) and only differ in the last bit. Similarly, the digital values assigned to distribution S4 (1100) and neighboring distribution S5 (0100) have the last three bits the same (100) and only differ in the first bit. Parity data (column 3) consists of one parity bit for each assigned digital value, which in this case is simply obtained by an Exclusive OR (XOR) operation on the bits of the digital value. Because a grey code is used for assignment of memory states, parity bits alternate 0-1-0-1 as shown. In other examples, other parity schemes (or different encoding schemes) may be used. While the digital values are shown mapped to distributions S0-S15, which may be achieved after fine programming, it will be understood that the same digital values are similarly mapped to first distributions S0-S15', which may result from foggy programming. Thus, for example, both S3 and S3' distributions are mapped to digital value 1101, both S12 and S12' distributions are mapped to digital value 1010, etc. Use of a gray code assignment scheme with parity data may facilitate recovery of data from memory cells that are foggy programmed (e.g. memory cells that have not yet been fine programmed and are in data states S1'-S15', not in states S1-S15).

Figure 13A:
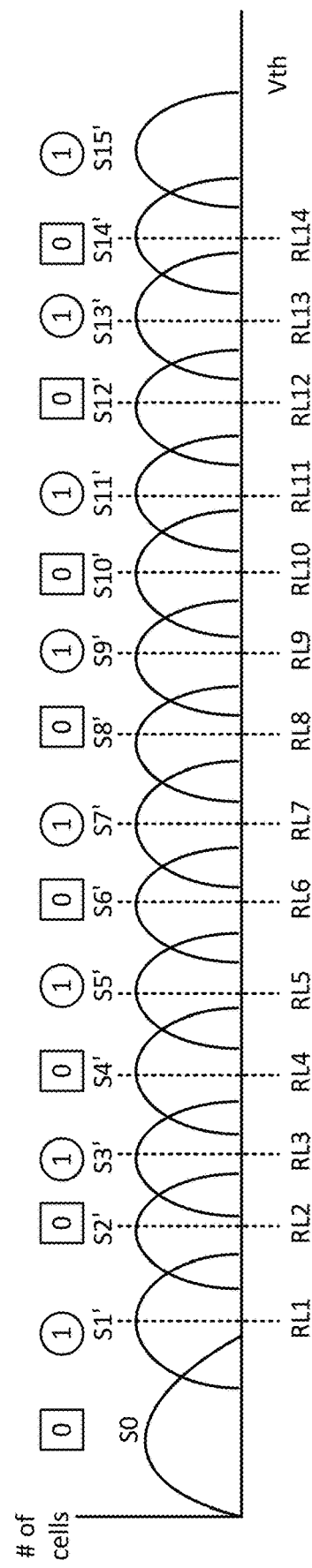
FIG. 13A illustrates an example of a foggy read of memory cells that have been foggy-programmed.

FIG. 13A illustrates an example of how a suitable gray code assignment with parity data (e.g. as illustrated in FIG. 12 or using a different gray code) may be used to facilitate accurate recovery of data from memory cells that are foggy programmed. FIG. 13A shows distributions S1'-S15' (in addition to erased distribution S0), with one-bit parity data indicated above each distribution (either a 1 or 0 value). This corresponds to memory cells that are in a foggy programmed condition (e.g. while neighboring memory cells are being programmed) with parity data generated e.g. as shown in FIG. 12. A series of read steps may be performed at read levels RL1 to RL14 as illustrated in FIG. 13A. Read levels RL1 to RL14 are not located between distributions as in previous examples (e.g. not like VrA-VrG of FIG. 8 or VrS1-VrS15 of FIG. 9). Instead, each read level RL1 to RL14 is located at or near the middle (midpoint) of a distribution, or about halfway between distributions on either side. For example, RL3 is about halfway between distribution S2' and distribution S4', which is in the middle of distribution S3'. Thus, RL3 is between two distributions (S2' and S4') with even parity values (parity value=0) at or near the middle of a distribution (S3') with an odd parity value (parity value=1). Read levels RL1 to RL14 are located at or near the middle of distributions S1 to S14 (i.e. at or near the middle of all distributions except the lowest distribution, S0, and highest distribution, S15).

Reading foggy-programmed data states S1' to S15' at the fourteen read levels RL1-RL14 in combination with parity values shown (which alternate according to the gray code used) may be sufficient to accurately recover data programmed in a foggy programming operation. In some cases, this may allow data that is foggy programmed to be directly recovered from foggy programmed memory cells so that a safe copy does not have to be maintained elsewhere (e.g. may not require a safe copy in SLC or in volatile memory).

Memory cells that turn on (become conductive or undergo a tripping event, e.g. as detected by a sense block) when RL1 is used (e.g. when a voltage at RL1 is applied to a corresponding word line) may be in either the S0 or S1' distributions. Which of these distribution a given cell is in may be determined from the parity bit associated with the cell (e.g. any cell that turns on with RL1 and has parity=0 is in distribution S0, while any cell that turns on with RL1 and has parity=1 is in distribution S1'). In this way, all memory cells in the S0 distribution (and some memory cells in the S1' distribution) may be found from a read at RL1. Memory cells that do not turn on with RL1 and turn on with RL2 (tripping event detected between RL1 and RL2) may be in either S1' or S2' distributions. Which of these distribution a given cell is in may be determined from the parity bit associated with the cell (e.g. any cell that first turns on with RL2 and has parity=1 is in distribution S1', while any cell that first turns on with RL2 and has parity=0 is in distribution S2'). In this way, remaining memory cells in the S1' distribution (and some memory cells in the S2' distribution) may be found from a read at RL2. Memory cells that do not turn on with RL1 or RL2 and turn on with RL3 may be in either S2' or S3' distributions. Which of these distribution a given cell is in may be determined from the parity bit associated with the cell (e.g. any cell that first turns on with RL3 and has parity=0 is in distribution S2', while any cell that first turns on with RL3 and has parity=1 is in distribution S3'). In this way, remaining memory cells in the S2' distribution (and some memory cells in the S3' distribution) may be found from a read at RL3. This approach may extend through RL14 to identify all cells in S0 and S1'-S13' and some cells in S14'. Memory cells that do not turn on (do not experience a tripping event) when RL14 is applied are either in distribution S14' or S15' and these may be distinguished by respective parity bits (memory cells that do not turn on with RL14 and have parity=0 are in distribution S14' while memory cells that do not turn on with RL14 and have parity=1 are in distribution S15').

FIGS. 13B-D illustrates implementations of reading QLC cells that have been foggy programmed as illustrated in FIG. 13A (e.g. memory cells in a NAND structure as illustrated in FIGS. 6A-C or other memory structure). FIG. 13B illustrates an assignment scheme that assigns digital values to sixteen distributions S0-S15 using a gray code to ensure that adjacent distributions differ by only one bit. Distributions S0-S15 are listed in the first column with digital values (or memory states) listed in the second column and parity values corresponding to each digital value listed in the third column. Parity values may be obtained by XORing the four bits of the corresponding digital value. The scheme illustrated in FIG. 13B may be an alternative to the scheme illustrated in FIG. 12 (other encoding schemes, including different parity schemes, may also be used). Encoding data using the parity values shown in FIG. 13B may allow subsequent recovery of data that is foggy programmed.

FIG. 13C illustrates how reading memory cells at read levels RL1-RL14 as illustrated in FIG. 13A may be combined with parity bits to recover data that has been foggy programmed. Read levels are listed in the first column with initial values (four-bit digital values) listed in the second column. For each cell with an initial value in the second column, the recovered value (decoded value) depends on the parity bit for the cell. Parity bits are listed in the third column and corresponding recovered values are listed in the fourth column. Decoding foggy-read data (e.g. initial values) using parity values to obtain recovered values may make maintaining a safe copy of foggy-programmed data unnecessary in some cases.

Memory cells that turn on at RL1 may be assigned an initial value 1111 (corresponding to distribution S0 in the table of FIG. 13B). If the corresponding parity bit=0 then the recovered value is also 1111 (e.g. memory cell is in distribution S0) and if the parity bit=1 then the recovered value is 1110 (e.g. memory cell is in distribution S1' and the fourth bit is flipped). Memory cells that do not turn on at RL1 and turn on at RL2 may be assigned an initial value 1110 (corresponding to distribution S1 or S1' in the table of FIG. 13B). If the corresponding parity bit=1 then the recovered value is also 1110 (e.g. memory cell is in distribution S1' and the initial value is used as the recovered value) and if the parity bit=0 then the recovered value is 1010 (e.g. memory cell is in distribution S2' and the second bit is flipped). Memory cells that do not turn on at RL1 or RL2 and turn on at RL3 may be assigned an initial value 1010 (corresponding to distribution S2 or S2' in the table of FIG. 3B). If the corresponding parity bit=0 then the recovered value is also 1010 (e.g. memory cell is in distribution S2' and the initial value is used as the recovered value) and if the parity bit=1 then the recovered value is 1000 (e.g. memory cell is in distribution S3' and the third bit is flipped). This approach continues as shown in FIG. 13C until RL14, where memory cells that first turn on at RL14 are assigned an initial value of 0111 (corresponding to distribution S13 or S13' in the table of FIG. 13B) and, depending on the corresponding parity values, are assigned recovered values of either 0111 (if parity=1) or 0011 (if parity=0). Remaining memory cells that do not turn on at RL14 (indicated by "Remaining" in FIG. 13C) are assigned an initial value of 0011 (corresponding to distribution S14 or S14') and, depending on the corresponding parity values, are assigned recovered values of either 0011 (if parity=0), corresponding to distribution S14, or 1011 (if parity=1), corresponding to distribution S15.

Foggy reading with parity data to recover values may be implemented in various ways. FIG. 13D illustrates an example that applies logic operations to the initial value (bits T, C, B, and A) and parity bit (S) to flip a bit when indicated by the corresponding logic operation. For example, in the first line, the initial value 1111 may occur with parity bit 0 or 1. If the parity bit is 1 (T&C&B&A&S), then bit A is flipped to 0 (A=0) and otherwise the initial value 1111 is used as the recovered value. In the second line, the initial value 1110 may occur with parity bit 0 or 1. If the parity bit is 0 (T&C&B&!A&! S, where "!" indicates the inverse so !A is the inverse of A, i.e. if A=0, !A=1 and if A=1, !A=0), then bit C is flipped to a 0 (C=0) and otherwise the initial value 1110 is used as the recovered value. In the third line, the initial value 1010 may occur with parity bit 0 or 1. If the parity bit is 1 (T&!C&B&!A&S), then bit B is flipped to a 0 (B=0) and otherwise the initial value 1010 is used as the recovered value. It can be seen that for the sixteen values illustrated for a QLC memory, fifteen logic operations may be sufficient to obtain the recovered values. Because a grey code is used, for any given initial value, there is only one bit to flip depending on the parity bit. The bits to be flipped are shaded for illustration.

Simple logic operations such as AND operations may be implemented on a memory die. In some cases, such logic operations may be applied while data is held in data latches such as data latches 194-197 (e.g. with additional latches for parity data). Bits may be flipped according to the scheme while data remains in latches (e.g. prior to being used to write the recovered values in a fine write operation). Reading foggy programmed data as illustrated in FIG. 13A may result in initial values being latched in data latches 194-197. When this data is combined with parity values (e.g. using logic operations illustrated in FIG. 13D) the recovered values may be obtained by flipping bits while the data remains in data latches 194-194. This recovered data may then be written back from data latches 194-197 to the same memory cells in a fine write operation so that transfer of initial values and recovered values to other circuits (e.g. outside a memory die) is unnecessary.

Figure 13E:
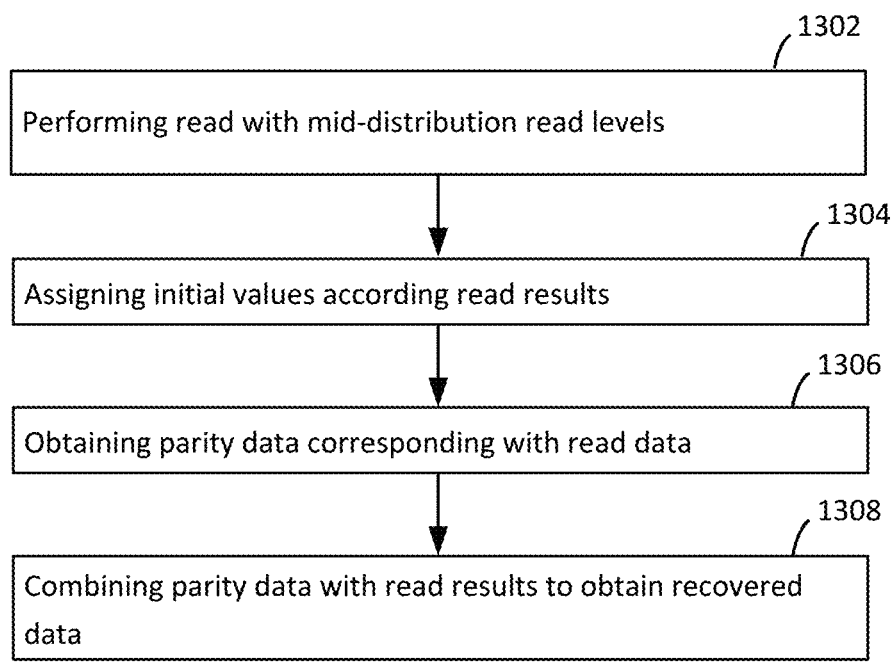
FIG. 13E illustrates an example of a method of performing a foggy read.

FIG. 13E illustrates an operation to recover data from memory cells that are foggy programmed by using parity data (e.g. as in the example of FIGS. 13A-D above). The method includes performing a read with mid-distribution read levels 1302 (e.g. RL1-RL14 as illustrated in FIG. 13A), assigning initial values according to read results 1304 (e.g. initial values corresponding to RL1-RL14 as illustrated in FIG. 13C), obtaining parity data corresponding with read data 1306 (parity data may be generated prior to foggy programming and may be saved for subsequent use), and combining parity data with read results to obtain recovered data 1308 (e.g. by flipping a bit of an initial value when indicated by a parity bit as illustrated in FIGS. 13C-D).

Recovery of data from foggy programmed memory cells (decoding) as illustrated in FIGS. 13A-D uses parity data in combination with results of a foggy read operation. Parity data may be calculated when the data is written, or before it is written, and may be stored in an appropriate location. For example, parity data may be calculated in a memory controller before it is sent to a memory die and may be stored in a volatile memory (e.g. DRAM) until it is needed to recover foggy programmed data.

Figure 14:
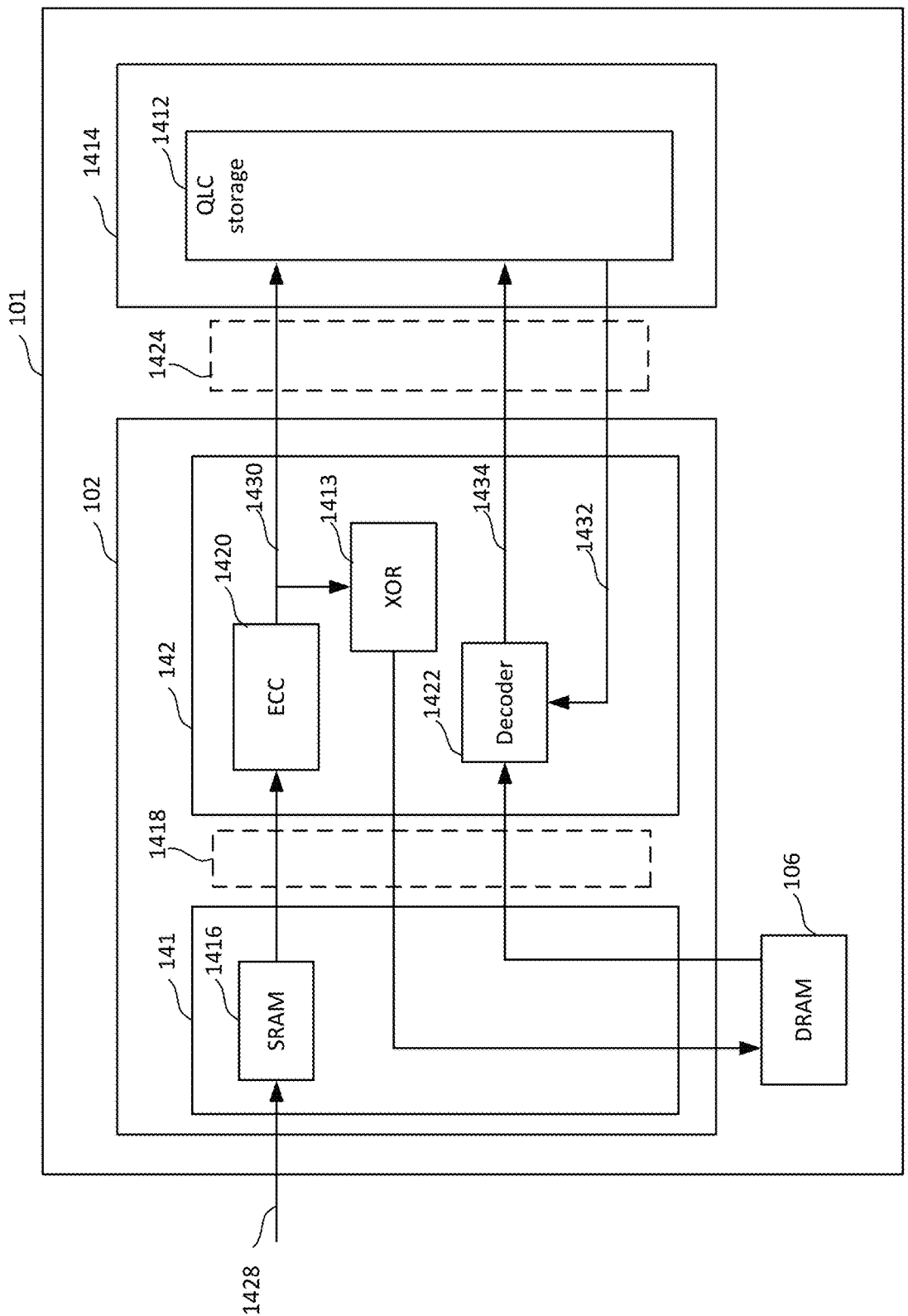
FIG. 14 illustrates an example of a memory device using foggy-fine programming with off-chip encoding.

FIG. 14 illustrates an example in which memory device 101 (e.g. as shown in FIG. 1A) is modified to implement encoding and decoding of data from memory cells that are foggy programmed in QLC storage 1412 in a non-volatile memory die 1414 (e.g. an individual non-volatile memory die of non-volatile memory 104). Controller 102 includes FEP circuit 141 and BEP circuit 142 including SRAM 1416. FEP circuit 141 is connected to BEP circuit 142 via a bus 1418 (e.g. PCIe interface). BEP circuit 142 includes an ECC circuit 1420 (e.g. ECC engine 226/256), which may implement Low Density Parity Check (LDPC) encoding and decoding), a parity circuit, which in this case is an XOR circuit 1413 (e.g. XOR circuit 1413 may be implemented by XOR engine 224/254) and a decoder circuit 1422 (e.g. implemented using a processor 220/250). Controller 102 is connected to non-volatile memory die 1414 through bus 1424 (e.g. memory bus 294).

Data is received from a host at input 1428 and is transferred from SRAM 1416, through bus 1418 to ECC circuit 1420 which encodes the data and transfers it 1430, through bus 1424 for foggy programming in QLC storage 1412 and also sends it to XOR circuit 1413, which calculates XOR bits that are saved in local memory (DRAM 106 in this example). Subsequently, other writes may occur while the data remains foggy programmed and at some later point in a programming sequence (e.g. sequence illustrated in FIG. 11) the data may be fine programmed. At the time of fine programming, a foggy read (e.g. as illustrated in FIGS. 13A-D) may be performed and the results transferred 1434 to decoder 1422 (e.g. initial values illustrated in FIG. 13C may sent from read/write circuits of non-volatile memory die 1414 to decoder 1422). Decoder 1422 also receives XOR bits from DRAM 106 and combines the foggy read results with the XOR bits to obtain recovered data (e.g. as illustrated in FIG. 13C). These results are then transferred 1434 and written in the same memory cells in a fine program operation (e.g. same memory cells that were foggy programmed are further programmed).

It can be seen that this example includes transfer of significant data between components (e.g. between controller 102 and memory die 1414 over bus 1424 and between FEP circuit 141 and BEP circuit 142 over bus 1418). For example, in QLC storage, four logical pages of data may be stored together and the results of XORing four such pages is a page of parity data. In the scheme illustrated in FIG. 14, programming such data includes transfer 1430 of the four logical pages of data, subsequent transfer 1432 (through bus 1424) of four pages obtained from a foggy read to controller 102, and transfer 1434 of four pages of recovered data back to memory die 1414 for fine programming. This may result in significant traffic on bus 1424 especially where the bus is shared between multiple memory dies (e.g. as illustrated in FIG. 1D). Furthermore, significant space may be occupied in local memory 106 by XOR data (e.g. one logical page of XOR data for every four logical pages of data that are foggy programmed). Accessing XOR data in DRAM 106 may produce significant traffic on bus 1418.

Figure 15A:
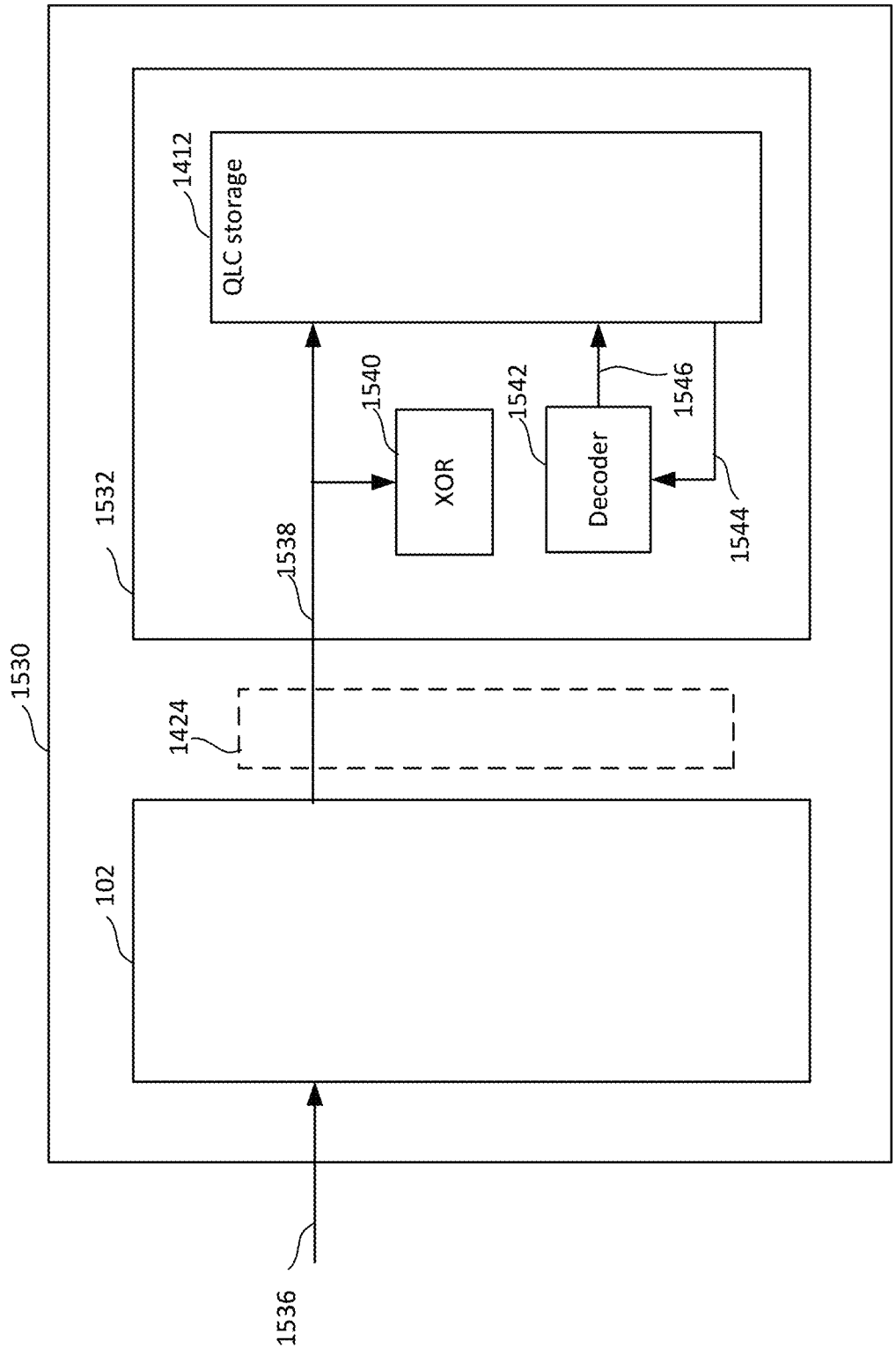
FIG. 15A illustrates an example of a memory device using foggy-fine programming with on-chip encoding.

FIG. 15A shows an example of a memory device 1530, which is configured to perform on-chip encoding and decoding for foggy-fine programming. Memory die 1532 includes parity data generating circuits, XOR circuits 1540 in this example, which are configured to generate parity data (XOR data) in memory die 1532. XOR circuits 1540 may be considered as means for calculating parity data for data to be stored in non-volatile memory cells of QLC storage 1412. For example, when data is transferred 1536 to memory device 1530, the data may be transferred 1538 (along with any ECC data) from controller 102, through bus 1424 to QLC storage 1412 and also to XOR circuit 1540 of memory die 1532. The data may be foggy programmed in QLC storage 1412 and may also be used to generate parity data (XOR data in this example). The parity data may be saved while the data is foggy programmed until fine programming is initiated. Memory die 1532 also includes on-chip decoder 1542, which is configured to receive foggy read data from QLC storage 1412 (transfer 1544) and to decode the foggy read data using XOR data previously generated by XOR circuit 1540. The decoded data that is recovered in this way is transferred 1546 to QLC storage 1412 in a fine programming operation. Generating parity data on-chip and performing decoding on-chip in this way may allow foggy-fine programming to be performed without a safe copy of data (e.g. using the combination of foggy programmed data and parity data instead of a safe copy) and with relatively little traffic on bus 1424. For example, when four logical pages of data are to be written, the four logical pages are transferred 1538 to memory die 1532. Subsequently, four logical pages of foggy read data are transferred to on-chip decoder 1542, which does not generate traffic on bus 1424, and recovered data is transferred 1546 back to QLC storage 1412 also without generating traffic on bus 1424. In some cases, XOR data may be saved in SLC storage in memory die 1532 so that parity data may be saved and recovered without generating traffic on bus 1424 (in other examples, XOR data from XOR circuit 1540 may be saved off-chip, e.g. in memory controller 102 or in a volatile memory connected to memory controller 102).

Figure 15B:
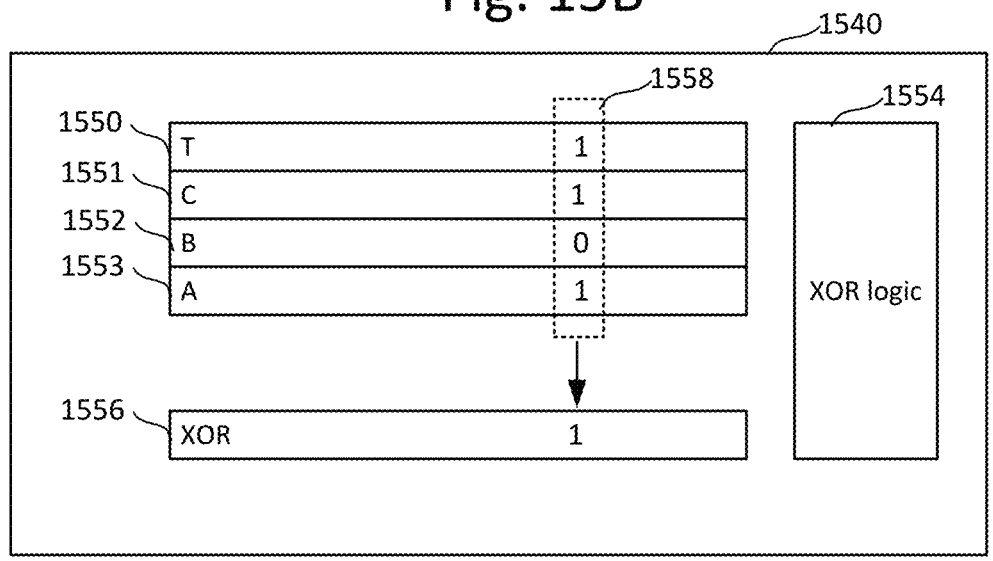
FIG. 15B illustrates an example of generation of parity data (encoding) for foggy-programming.

FIG. 15B illustrates an example implementation of on-chip XOR circuits 1540, which includes four sets of data latches 1550-1553 corresponding to four logical pages of data to be programmed in a physical page of QLC storage 1412 (logical pages labeled "T", "C", "B", and "A" respectively). For example, each set of latches may have capacity for one logical page of data from a host along with ECC data (e.g. calculated by ECC circuits of memory controller 102) and any other overhead data that may be stored with data from a host. XOR circuits 1540 includes XOR logic circuit 1554, which is configured to perform an XOR logic operation on each set of bits corresponding to a memory cell of QLC storage 1412 and generate a corresponding bit of XOR data (parity data). XOR logic circuit 1554 may be considered an example of means for calculating parity data for data to be stored in the plurality of non-volatile memory cells. Parity data is stored in a set of data latches 1556. An example set of bits 1558 are to be programmed to a memory cell of QLC storage 1412. XOR logic circuit 1554 calculates a corresponding parity bit (in this case "1") corresponding to bits 1101 of set of bits 1558. For example, modulo 2 addition or other technique may be used to generate XOR bits (e.g. where there is an odd number of "1" bits, the XOR result is "1"). Where parity bits are generated in other ways (not XOR) different logic may be applied to generate parity bits. Data latches 1550-1553 may be implemented by data latches 194-197 of FIG. 3A and encoding (calculation of XOR bits in this example) may be performed when data is in latches before or during foggy programming. Data latches 1550-1553 (e.g. data latches 194-197) in combination with additional circuits of sense block 51, may be considered an example of a means for programming the plurality of non-volatile memory cells to first distributions.

Figure 15C:
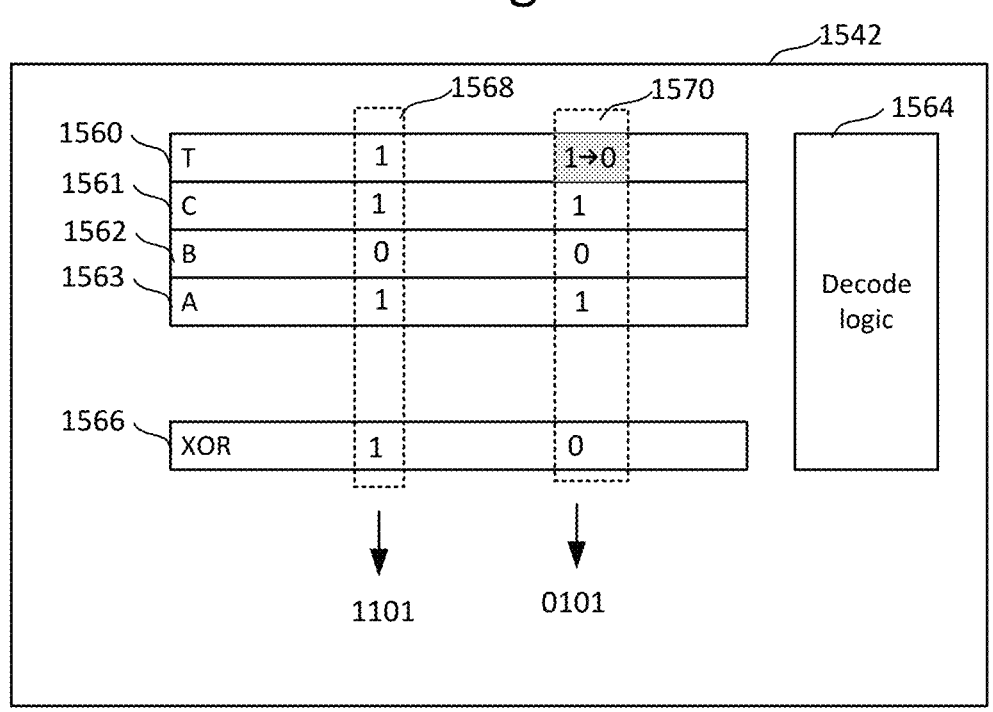
FIG. 15C illustrates an example of recovery of data using initial values from foggy-read in combination with parity data (decoding).

FIG. 15C shows an example of on-chip decoder 1542, which includes four sets of data latches 1560-1563 corresponding to four logical pages of data obtained from a foggy read of a page of QLC storage 1412. For example, each set of latches may have capacity for one logical page of data along with ECC data and any other overhead data that may be stored with data received from a host. In some examples, the same physical data latches may be used as XOR data latches 1550-1553 and for decode data latches 1560-1563 (e.g. data latches 194-197). When a foggy read is performed (e.g. as illustrated in FIG. 13A) initial data states may be loaded in data latches 1560-1563 (e.g. initial values listed in FIG. 13C). Data latches 1560-1563 (e.g. data latches 194-197) in combination with additional circuits of sense block 51, may be considered an example of a means for reading the plurality of non-volatile memory cells in the first distributions. On-chip decoder 1542 include decode logic circuit 1564, which combines the initial values obtained from such a foggy read with parity data (e.g. XOR data generated by XOR circuits 1540 prior to foggy programming) in a set of data latches 1566. Decode logic circuit 1564 may combine foggy read data and parity data as illustrated in FIGS. 13C-D so that an initial value from a memory cell may be used as a recovered value, or one bit may be flipped, depending on the parity value associated with the memory cell. For example, decode logic circuit 1564 may include AND logic and NOR logic circuits to perform the logic operations illustrated in FIG. 13D. In a first example 1568, foggy reading of a memory cell provides an initial value 1101 (e.g. memory cell becomes conductive at RL12) and the corresponding XOR bit for the memory cell is 1. Decode logic circuit 1564 generates a recovered value of 1101 in this case (as shown in the corresponding entries of FIG. 13C-D). In a second example 1570, foggy reading of another memory cell provides an initial value 1101 and the corresponding XOR bit for the memory cell is 0. Decode logic circuit 1564 generates a recovered value of 0101 in this case (as shown in the corresponding entries of FIG. 13C-D). Decode logic circuit 1564 may simply flip bit T (shaded) to 0 according to the logic operation illustrated in FIG. 13D (If T&C&!B&A&!S then set T=0) so that the initial value is replaced with the recovered value while in latches 1560-1563. Decode logic circuit 1564 is configured to generate the recovered values of FIGS. 13C-D from corresponding initial values obtained by foggy reading of memory cells of QLC storage 1412 in combination with XOR bits. These recovered values may then be used to perform fine programming of memory cells (e.g. the same memory cells that were foggy programmed are further programmed as illustrated in FIG. 10 based on recovered values). Data may be fine programmed from data latches 1560-1563 (e.g. data latches 194-197). On-chip decode 1542 may be considered as an example of a means for recovering the data from results of reading the plurality of non-volatile memory cells in the first distributions combined with the parity data and further programing the plurality of non-volatile memory cells from the first distributions to second distributions to store the data.

Figure 16:
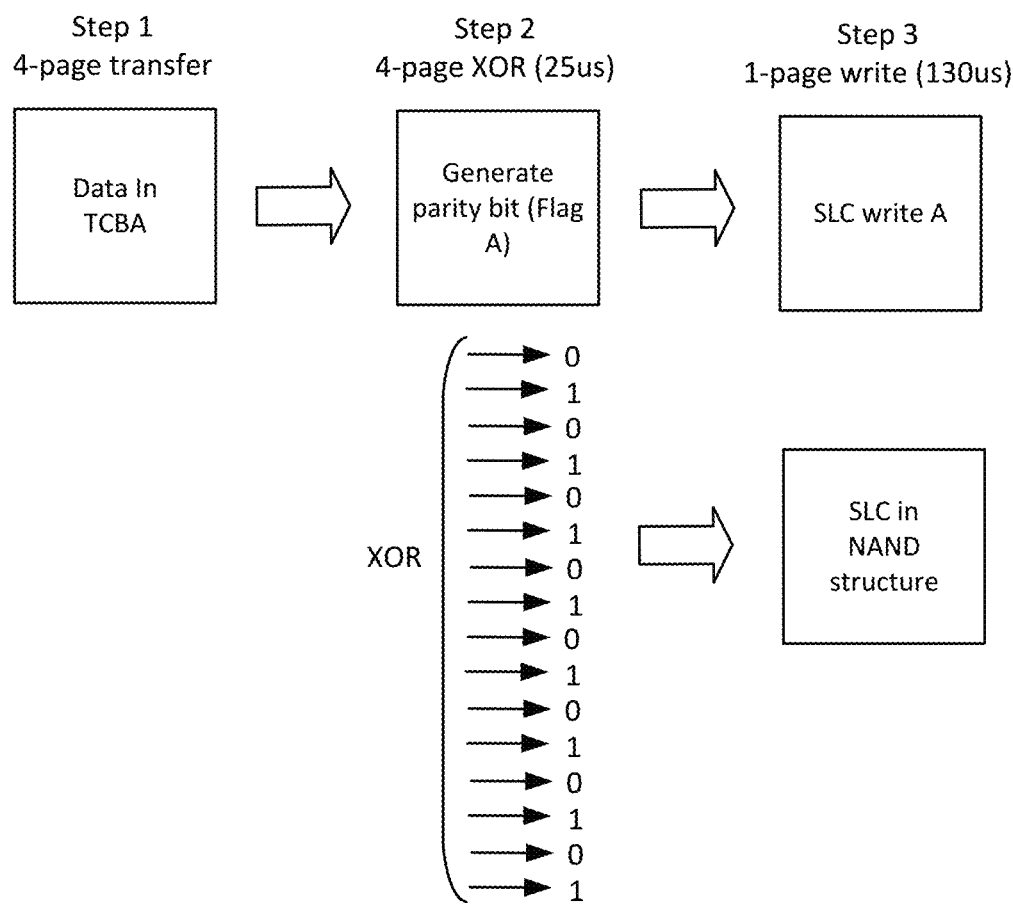
FIG. 16 illustrates an example of on-chip encoding using XOR.

FIG. 16 illustrates an example of a series of steps used in programming. In Step 1, four logical pages of data are transferred to a memory die (e.g. memory die 1532) and are loaded in corresponding sets of data latches (e.g. latches T, C, B, A). In step 2, the four logical pages are subject to an XOR operation to generate an XOR bit (or flag "A") for each memory cell to be programmed. In the example of FIG. 16, this takes 25 us. In step 3, the XOR bits (one logical page of XOR data generated from four logical pages of transferred data) are written in SLC memory (e.g. written in a portion of NAND memory on memory die 1532 that is designated as SLC). In the example of FIG. 16, this takes 130 us. Thus, on-chip encoding (by XORing) and storing of XOR data in SLC may be rapidly performed. It will be understood that SLC portions and QLC portions may be separate structures or may both be formed in a common structure (e.g. some blocks of a structure may be designated as QLC blocks and others as SLC blocks, and these designations may change over time).

Figure 17:
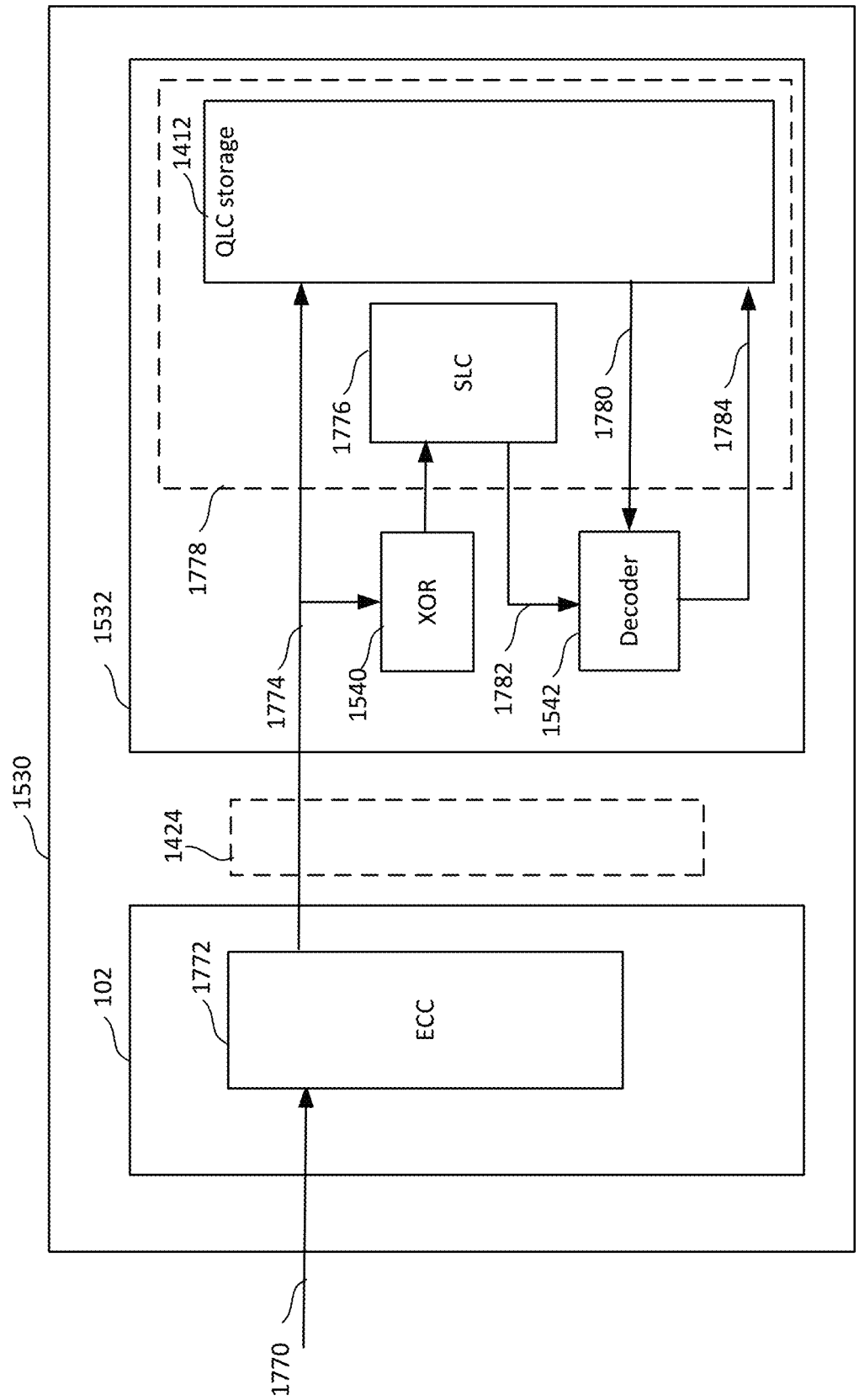
FIG. 17 illustrates an example implementation of foggy-fine programming with parity data stored on-chip in SLC memory cells.
Figure 18:
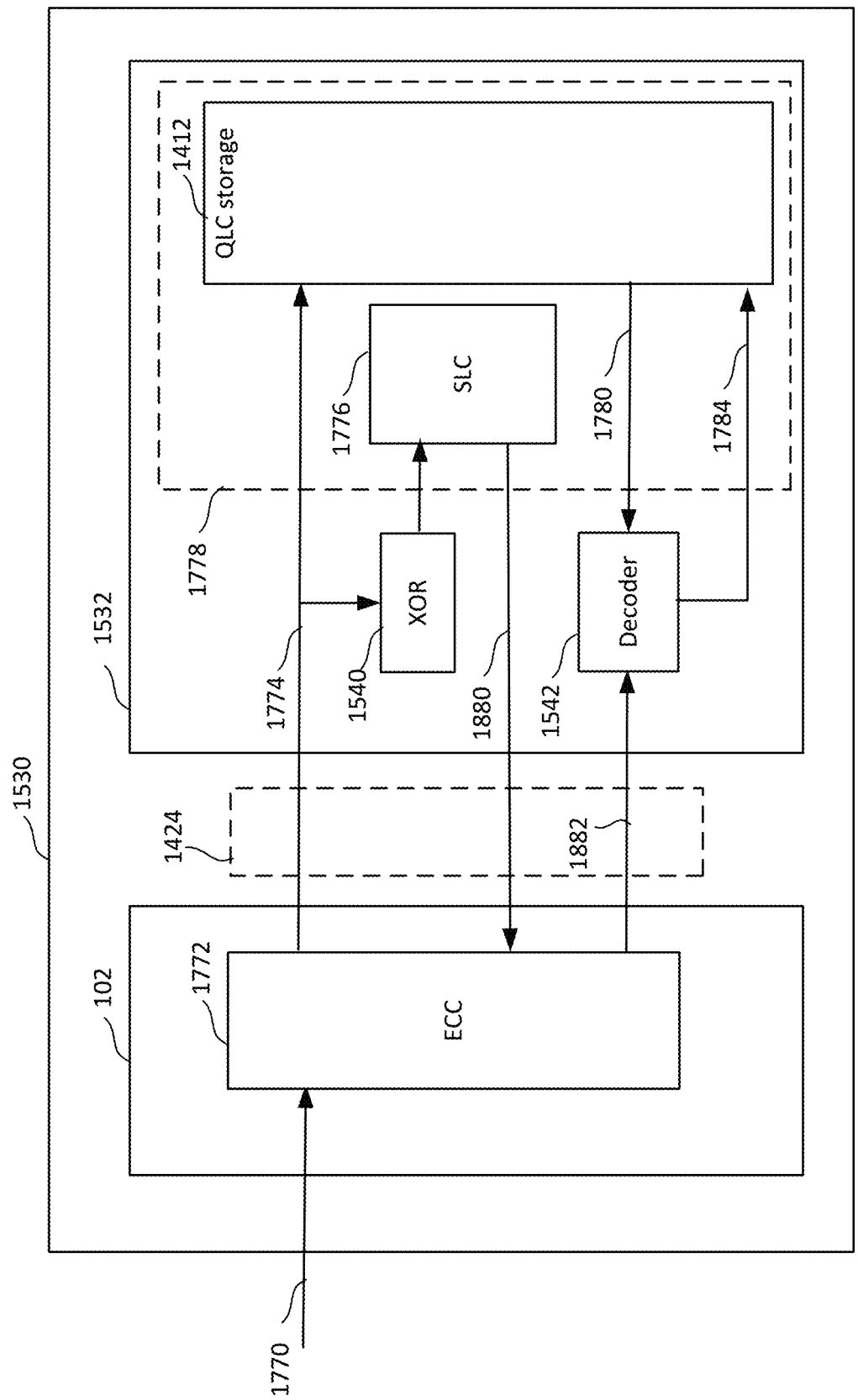
FIG. 18 illustrates an example implementation of foggy-fine programming with parity data corrected by ECC.
Figure 19:
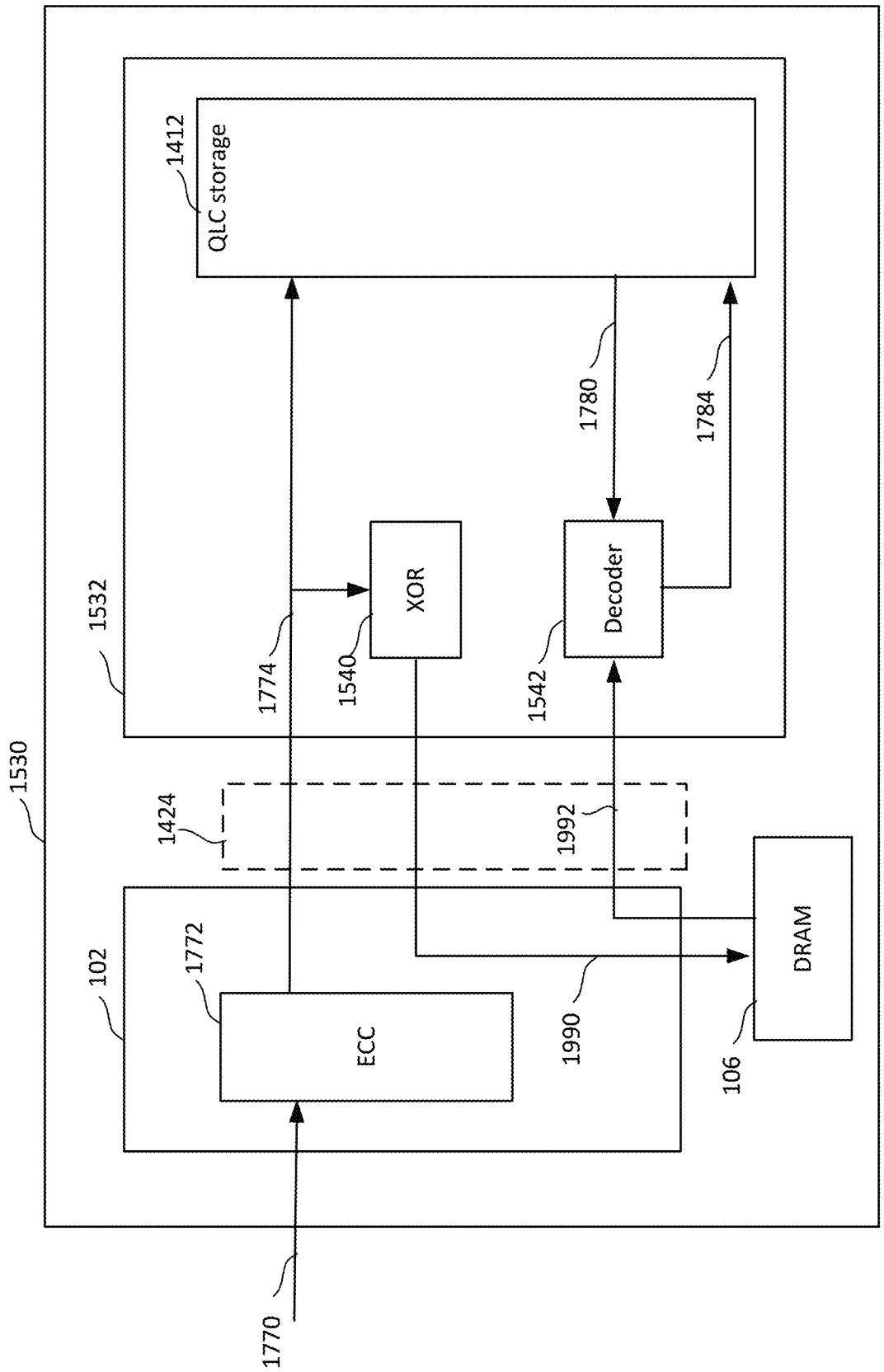
FIG. 19 illustrates an example implementation of foggy-fine programming with parity data stored off-chip in DRAM.

On-chip encoding and decoding for foggy-fine programming as described in any of the examples above may be implemented in various ways including, but limited to, the examples of FIGS. 17-19. FIG. 17 shows an example in which SLC memory cells are used to store parity data (e.g. XOR data) for later use in fine programming. A data transfer 1770 (e.g. from a host) is received by memory controller 102 and the data is ECC encoded by ECC circuit 1772. Encoded data is then transferred 1774, via bus 1424, to QLC storage 1412 where it is foggy programmed, and also transferred to XOR circuits 1540, which generate XOR bits that are then stored in SLC cache 1776. SLC cache 1776 is a portion of structure 1778 (e.g. 3-D NAND memory structure) that is configured for SLC data storage. Structure 1778 also includes QLC storage 1412 and these portions may be reconfigurable. After foggy programming, while the data is in QLC storage 1412 and corresponding XOR data is in SLC cache 1776, other data may be programmed (e.g. as illustrated in FIG. 11). Subsequently, fine programming may be scheduled, and a foggy read may be performed to read initial values from QLC storage 1412 to decoder 1524 (transfer 1780) and XOR data may be read from SLC cache 1776

(transfer 1782). Decoder 1542 then generates recovered values from the combination of foggy read data and XOR data (e.g. decoding as illustrated in FIG. 13C). These recovered values are then used to perform fine programming of the memory cells that were previously foggy programmed (transfer 1784). Thus, in this example, the only transfer of data across bus 1424 is when the initial data (e.g. four logical pages of user data and any overhead) is transferred to memory die 1532. Subsequent transfers of XOR data, foggy read data, and recovered data occur internally in memory die 1532.

FIG. 18 illustrates another example in which SLC memory cells are used to store parity data (XOR data) for later use in fine programming. A data transfer 1770 (e.g. from a host) is received by memory controller 102 and the data is ECC encoded by ECC circuit 1772. Encoded data is then transferred 1774, via bus 1424, to QLC storage 1412 where it is foggy programmed, and also transferred to XOR circuits 1540, which generate XOR bits that are then stored in SLC cache 1776. Subsequently, fine programming may be scheduled, and a foggy read may be performed to read initial values from QLC storage 1412 to decoder 1524 (transfer 1780). In this example, XOR data is not directly transferred from SLC cache 1776 to decoder 1542. XOR data from SLC cache 1776 is transferred to ECC circuit 1772 of memory controller 102, via bus 1424 (transfer 1880) where error correction is performed. Corrected XOR data (decoded parity data) is transferred, via bus 1424, to decoder 1542 (transfer 1882). ECC circuit 1772 may be considered an example of a means for Error Correction Code (ECC) decoding parity data and sending decoded parity data to decoder 1542. Decoder 1542 then generates recovered values from the combination of foggy read data and corrected XOR data (e.g. as illustrated in FIG. 13C). These recovered values are then used to perform fine programming of the memory cells that were previously foggy programmed (transfer 1784). Thus, in this example, in addition to the initial transfer 1774 (e.g. four logical pages) across bus 1424, there is also transfer of XOR data (e.g. one logical page for the four logical pages of data) from memory die 1532 to memory controller 102 and transfer of corrected XOR data back from memory controller 102 to memory die 1532 on bus 1424. Because errors in XOR data may result in errors in recovered data and therefore errors in fine programmed data, reduction or elimination of such errors using ECC may justify the additional traffic on bus 1424.

While parity data may be separately encoded by ECC circuit 1772 prior to storage in SLC cache 1776, in some cases no separate encoding is required where, for example, the parity data is an XOR product of encoded data (e.g. XOR product of codewords may provide a codeword so that separate encoding is not required). ECC correction of parity data may be applied to all data or may be selectively used. For example, ECC correction may be used for selected blocks (blocks with high errors), selected portions of a given block (e.g. lower levels of a 3-D block), or in response to a triggering event (e.g. after a certain number of write-erase cycles, a temperature above a threshold, or other such event). Thus, memory device 1530 may use both the scheme of FIG. 17 and the scheme of FIG. 18 at different times and/or for data in different portions of QLC storage 1412.

FIG. 19 illustrates an example in which local memory, DRAM 106, is used to store parity data (XOR data) for later use in fine programming. A data transfer 1770 (e.g. from a host) is received by memory controller 102 and the data is ECC encoded by ECC circuit 1772. Encoded data is then transferred 1774, via bus 1424, to QLC storage 1412 where it is foggy programmed, and also transferred to XOR circuits 1540, which generate XOR bits that are then transferred to DRAM 106 (transfer 1990). Subsequently, fine programming may be scheduled, and a foggy read may be performed to read initial values from QLC storage 1412 to decoder 1524 (transfer 1780). XOR data is transferred from DRAM 106 to decoder 1542 (transfer 1992). Decoder 1542 then generates recovered values from the combination of foggy read data and XOR data (e.g. as illustrated in FIG. 13C). These recovered values are then used to perform fine programming of the memory cells that were previously foggy programmed (transfer 1784). Thus, in this example, in addition to the initial transfer 1774 (e.g. four logical pages) across bus 1424, there is also transfer of XOR data (e.g. one logical page for the four logical pages of data) from memory die 1532 to DRAM 106 and transfer of XOR data back from DRAM 106 to memory die 1532 on bus 1424.

While in some examples described, encoding and decoding for foggy-fine programming is performed on-chip (e.g. by encoding and decoding circuits formed on the same die as the memory structure in which data is programmed), in other examples, encoding and decoding circuits may be located in a control die that is bonded to a memory die in an integrated memory assembly. For example, XOR circuits and decoder circuits of FIGS. 15A, and 17-19 may be located in such a control die.

Figure 20:
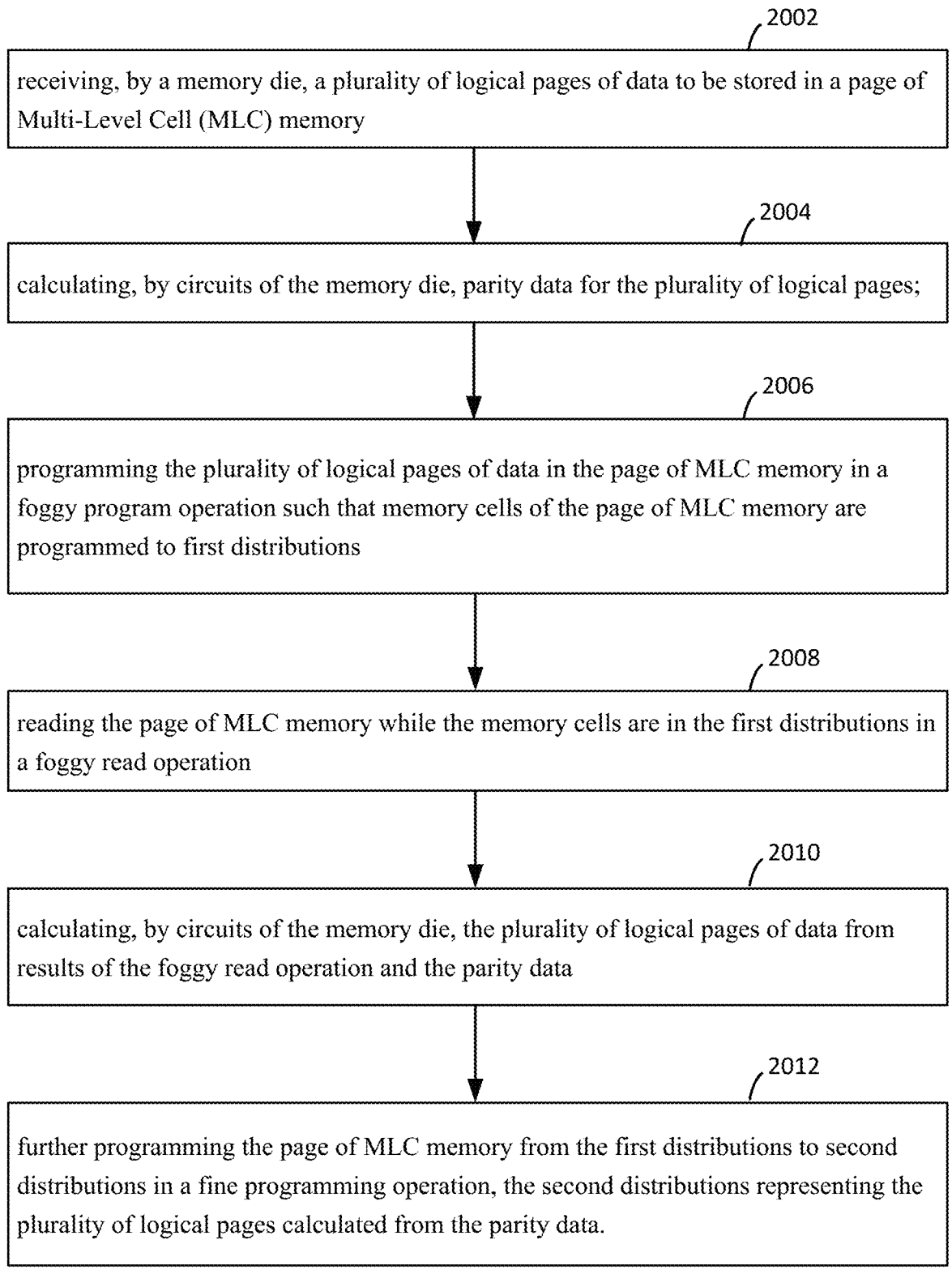
FIG. 20 illustrates an example of a method that includes programming data in a foggy program operation and further programming in a fine programming operation.

FIG. 20 is a flowchart illustrating an example of a method that implements aspects of the present technology. The method includes receiving, by a memory die, a plurality of logical pages of data to be stored in a page of Multi-Level Cell (MLC) memory 2002, calculating, by circuits of the memory die, parity data for the plurality of logical pages 2004 (e.g. calculating a page of XOR bits for four logical pages of user data to be stored), and programming the plurality of logical pages of data in the page of MLC memory in a foggy program operation such that memory cells of the page of MLC memory are programmed to first distributions 2006. The method further includes reading the page of MLC memory while the memory cells are in the first distributions in a foggy read operation 2008 (e.g. as illustrated in FIG. 13A) calculating, by circuits of the memory die, the plurality of logical pages of data from results of the foggy read operation and the parity data 2010 (e.g. calculating recovered values of FIG. 13C); and further programming the page of MLC memory from the first distributions to second distributions in a fine programming operation (e.g. as illustrated in FIG. 10), the second distributions representing the plurality of logical pages calculated from the parity data 2012. The method may include storing the parity data in the memory die in additional memory cells that are configured as Single Level Cell (SLC) cells and may further include reading the parity data from the SLC cells and performing Error Correction Code (ECC) decoding of the parity data prior to calculating the plurality of logical pages from the parity data, or may include sending the parity data from the memory die to be stored in a volatile memory and subsequently receiving the parity data from the volatile memory for the calculating (not illustrated in FIG. 20).

An example of a non-volatile storage apparatus, includes a plurality of non-volatile memory cells formed on a memory die, each non-volatile memory cell configured to hold a plurality of bits of data and a control circuit formed on the memory die, the control circuit configured to calculate parity data for data to be stored in the plurality of non-volatile memory cells, program the plurality of non-volatile memory cells to first distributions, read the plurality of non-volatile memory cells in the first distributions, recover the data from results of reading the non-volatile memory cells in the first distributions combined with the parity data, and further program the plurality of non-volatile memory cells from the first distributions to second distributions to store the data.

The control circuit may be further configured to program the parity data in additional non-volatile memory cells formed on the memory die, each additional non-volatile memory cell configured to hold one bit of data. The control circuit may be further configured to read the parity data from the additional non-volatile memory cells and send the parity data for Error Correction Code (ECC) decoding. The control circuit may be further configured to send the parity data for storage in volatile memory on a control die that is connected to the memory die and receive the parity data from volatile memory. The plurality of non-volatile memory cells may be located along a first word line of a NAND structure of the memory die, the control circuit further configured to program at least a second word line of the NAND structure between programming the plurality of non-volatile memory cells to the first distributions and further programming the plurality of non-volatile memory cells from the first distributions to the second distributions. The first distributions may consist of sixteen distributions representing four bits of data and the control circuit may be further configured to read the plurality of non-volatile memory cells in the first distributions using fourteen read voltages located at or near the middle of first distributions other than a lowest and a highest first distributions. The control circuit may be configured to program the plurality of non-volatile memory cells according to a Gray code such that neighboring distributions are assigned digital values that differ by one and only one bit. The control circuit may be configured to program the plurality of non-volatile memory cells to the first distributions in a foggy program operation such that first distributions have significant overlap and program the plurality of non-volatile memory cells from the first distributions to the second distributions in a fine programming such that the second distributions are narrower than the first distributions and have less overlap than the first distributions. The control circuit may be configured to calculate one logical page of parity data for four logical pages of data to be stored in the plurality of non-volatile memory cells, write the logical page of parity data in additional non-volatile memory cells formed on the memory die or send the logical page of parity data for storage outside the memory die, and subsequently read the logical page of parity data from the additional non-volatile memory cells or receive the logical page of parity data from outside the memory die for recovery of the data.

An example of a method includes receiving, by a memory die, a plurality of logical pages of data to be stored in a page of Multi-Level Cell (MLC) memory; calculating, by circuits of the memory die, parity data for the plurality of logical pages; programming the plurality of logical pages of data in the page of MLC memory in a foggy program operation such that memory cells of the page of MLC memory are programmed to first distributions; reading the page of MLC memory while the memory cells are in the first distributions in a foggy read operation; calculating, by circuits of the memory die, the plurality of logical pages of data from results of the foggy read operation and the parity data; and further programming the page of MLC memory from the first distributions to second distributions in a fine programming operation, the second distributions representing the plurality of logical pages calculated from the parity data.

Calculating the parity data for the plurality of logical pages may include calculating one parity bit for each memory cell of the page of MLC memory. Calculating the parity data may include performing an Exclusive OR (XOR) operation on the plurality of logical pages. The method may include storing the parity data in the memory die in additional memory cells that are configured as Single Level Cell (SLC) cells. The method may further include reading the parity data from the SLC cells and performing Error Correction Code (ECC) decoding of the parity data prior to calculating the plurality of logical pages from the parity data. The method may further include sending the parity data from the memory die to be stored in a volatile memory and subsequently receiving the parity data from the volatile memory for the calculating. The method may further include, subsequent to the foggy programming operation and prior to the foggy read operation, programming at least one other page of the MLC memory. The page of MLC memory may be along a first word line of a NAND memory structure and the at least one other page of the MLC memory may be along at least a second word line of the NAND memory structure. Reading the page of MLC memory while the memory cells are in the first distributions may include using read levels at or near midpoints of the first distributions.

An example of a non-volatile storage apparatus includes a memory die including a plurality of non-volatile memory cells and further including: means for calculating parity data for data to be stored in the plurality of non-volatile memory cells; means for programming the plurality of non-volatile memory cells to first distributions; means for reading the plurality of non-volatile memory cells in the first distributions; and means for recovering the data from results of reading the plurality of non-volatile memory cells in the first distributions combined with the parity data and further programing the plurality of non-volatile memory cells from the first distributions to second distributions to store the data.

The non-volatile storage apparatus may include a memory controller die connected to the memory die, the memory controller die including means for Error Correction Code (ECC) decoding the parity data and sending decoded parity data to the means for recovering the data.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A non-volatile storage apparatus, comprising:
an MLC page including a plurality of non-volatile memory cells formed on a memory die, each non-volatile memory cell configured to hold a plurality of bits of data; and
a control circuit positioned on the memory die, the control circuit configured to calculate parity data for a plurality of logical pages of data to be stored in the plurality of non-volatile memory cells, program the plurality of non-volatile memory cells to first distributions in a foggy program operation, read the plurality of non-volatile memory cells in the first distributions to obtain an initial copy of the plurality of logical pages of data in a foggy read operation, latch the initial copy into a plurality of latches on the memory die, combine the parity data and the initial copy in a plurality of logic operations including a plurality of AND operations applied between bits obtained from reading an individual non-volatile memory cell and a corresponding parity data bit to generate a plurality of logic outputs, correct the initial copy according to the plurality of logic outputs by flipping selected bits of the initial copy while the selected bits remain in respective latches of the plurality of latches to generate a recovered copy in the plurality of latches of the plurality of logical pages of data, and further program the plurality of non-volatile memory cells from the first distributions to second distributions to store the recovered copy by programming the recovered copy from the plurality of latches in a fine programming operation.

2. The non-volatile storage apparatus of claim 1, wherein the control circuit is further configured to program the parity data in additional non-volatile memory cells formed on the memory die, each additional non-volatile memory cell configured to hold one bit of data.

3. The non-volatile storage apparatus of claim 2, wherein the control circuit is further configured to read the parity data from the additional non-volatile memory cells and send the parity data for Error Correction Code (ECC) decoding.

4. The non-volatile storage apparatus of claim 1, wherein the control circuit is further configured to send the parity data for storage in volatile memory on a control die that is connected to the memory die and receive the parity data from the volatile memory.

5. The non-volatile storage apparatus of claim 1, wherein the plurality of non-volatile memory cells are located along a first word line of a NAND structure of the memory die, the control circuit further configured to program at least a second word line of the NAND structure between programming the plurality of non-volatile memory cells to the first distributions and further programming the plurality of non-volatile memory cells from the first distributions to the second distributions.

6. The non-volatile storage apparatus of claim 1, wherein the first distributions consist of sixteen first distributions representing four bits of data and the control circuit is further configured to read the plurality of non-volatile memory cells in the first distributions using fourteen read voltages, each read voltage located at a middle of a respective first distribution other than a lowest first distribution and a highest first distribution.

7. The non-volatile storage apparatus of claim 1, wherein the control circuit is configured to program the plurality of non-volatile memory cells according to a Gray code such that neighboring distributions are assigned digital values that differ by one and only one bit.

8. The non-volatile storage apparatus of claim 1, wherein the control circuit is configured to program the plurality of non-volatile memory cells to the first distributions in a foggy program operation such that the first distributions are overlapping and program the plurality of non-volatile memory cells from the first distributions to the second distributions in a fine programming such that the second distributions are narrower than the first distributions and have less overlap than the first distributions.

9. The non-volatile storage apparatus of claim 1, wherein the plurality of logical pages of data include four logical pages of data to be stored in the plurality of non-volatile memory cells, and wherein the control circuit is configured to calculate one logical page of parity data for the four logical pages of data, write the logical page of parity data in additional non-volatile memory cells formed on the memory die or send the logical page of parity data for storage outside the memory die, and subsequently read the logical page of parity data from the additional non-volatile memory cells or receive the logical page of parity data from outside the memory die for recovery of the four logical pages of data.

10. A method comprising:
receiving, by a memory die, a plurality of logical pages of data to be stored in a page of Multi-Level Cell (MLC) memory;
calculating, by circuits of the memory die, parity data for the plurality of logical pages of data;
programming the plurality of logical pages of data in the page of MLC memory in a foggy program operation such that memory cells of the page of MLC memory are programmed to first distributions;
reading the page of MLC memory while the memory cells are programmed to the first distributions in a foggy read operation to obtain, in data latches of the memory die, an initial copy of the plurality of logical pages of data;
performing, by logic circuits of the memory die, a plurality of AND operations on the initial copy of the plurality of logical pages of data and the parity data, wherein the plurality of AND operations are applied between bits obtained from reading an individual memory cell in the MLC memory and a corresponding parity data bit;
flipping selected bits of the initial copy of the plurality of logical pages of data while each selected bit remains in a respective data latch of the data latches according to results of the plurality of AND operations to obtain, in the data latches, a recovered copy of the plurality of logical pages of data; and
further programming the page of MLC memory from the first distributions to second distributions in a fine programming operation, the second distributions representing the recovered copy of the plurality of logical pages of data obtained according to the results of the plurality of AND operations.

11. The method of claim 10, wherein calculating the parity data for the plurality of logical pages of data includes calculating one parity bit for each memory cell of the page of MLC memory.

12. The method of claim 10 wherein performing the plurality of AND operations includes performing AND operations on four bits obtained from reading an individual memory cell and the corresponding parity data bit.

13. The method of claim 10 further comprising storing the parity data in the memory die in additional memory cells that are configured as Single Level Cell (SLC) cells.

14. The method of claim 13 further comprising reading the parity data from the SLC cells and performing Error Correction Code (ECC) decoding of the parity data prior to obtaining the recovered copy of the plurality of logical pages of data.

15. The method of claim 10 further comprising sending the parity data from the memory die to be stored in a volatile memory and subsequently receiving the parity data from the volatile memory for the obtaining the recovered copy of the plurality of logical pages of data.

16. The method of claim 10 further comprising, subsequent to the foggy programming operation and prior to the foggy read operation, programming at least one other page of the MLC memory.

17. The method of claim 10, wherein the plurality of logical pages of data consists of four logical pages of data and each memory cell of the page of Multi-Level Cell (MLC) memory is configured to store four bits using sixteen data states.

18. The method of claim 10, wherein reading the page of MLC memory while the memory cells are in the first distributions includes using read levels at midpoints of the first distributions.

19. A non-volatile storage apparatus, comprising:
- a memory die including a page of MLC memory cells including a plurality of non-volatile memory cells and further including:
- means for calculating parity data for a plurality of logical pages of data to be stored in the plurality of non-volatile memory cells;
- means for programming the plurality of non-volatile memory cells to first distributions in a foggy programming operation;
- means for reading the plurality of non-volatile memory cells in the first distributions into latches on the memory die to obtain an initial copy of the plurality of logical pages of data in the latches in a foggy read operation; and
- means for recovering the plurality of logical pages of data by performing a plurality of AND operations on the initial copy in the latches in combination with the parity data, wherein the plurality of AND operations are applied between bits obtained from reading an individual memory cell in the MLC memory cells and a corresponding parity data bit, flipping selected bits of the initial copy data while each selected bit remains in a respective latch according to outputs of the plurality of AND operations to obtain, in the latches, a recovered copy of the plurality of logical pages, and further programing the plurality of non-volatile memory cells from the first distributions to second distributions in a fine programming operation to store the recovered copy from the latches without sending the initial copy or the recovered copy from the memory die.

20. The non-volatile storage apparatus of claim 19 further comprising a memory controller die connected to the memory die, the memory controller die including means for Error Correction Code (ECC) decoding the parity data and sending decoded parity data to the means for recovering the plurality of logical pages of data.

\* \* \* \* \*